United States Patent [19]
Iwatsuki et al.

[11] Patent Number: 5,915,213
[45] Date of Patent: Jun. 22, 1999

[54] TRANSMITTER APPARATUS WITH LINEARIZING CIRCUIT TO COMPENSATE FOR DISTORTION IN POWER AMPLIFIER

[75] Inventors: Masanori Iwatsuki, Kawasaki; Shouichi Sato, Sendai; Kouichi Hayasaka, Sendai; Yasuhiro Shibuya, Sendai, all of Japan

[73] Assignee: Fujitsu Limited, Kanagawa, Japan

[21] Appl. No.: 08/739,800

[22] Filed: Oct. 30, 1996

[30] Foreign Application Priority Data

Oct. 30, 1995 [JP] Japan .................................... 7-282194
Jul. 15, 1996 [JP] Japan .................................... 8-184644

[51] Int. Cl.⁶ .................................................... H04B 1/04
[52] U.S. Cl. ........................... 455/116; 455/126; 375/297
[58] Field of Search ...................... 455/522, 126, 455/127, 116, 119; 375/296, 297; 330/278

[56] References Cited

U.S. PATENT DOCUMENTS

| | | | |
|---|---|---|---|
| 5,170,495 | 12/1992 | McNicol et al. ........................ | 455/116 |
| 5,175,879 | 12/1992 | Ellingson et al. ....................... | 455/126 |
| 5,251,330 | 10/1993 | Chiba et al. ............................. | 455/127 |
| 5,420,536 | 5/1995 | Faulkner et al. ......................... | 455/127 |
| 5,471,654 | 11/1995 | Okazaki et al. ......................... | 455/126 |
| 5,483,681 | 1/1996 | Bergsten et al. ........................ | 455/126 |
| 5,532,646 | 7/1996 | Aihara ..................................... | 455/127 |

*Primary Examiner*—Edward F. Urban
*Attorney, Agent, or Firm*—Helfgott & Karas, P.C.

[57] ABSTRACT

Simple and low-cost linearizing circuit for compensating for amplitude and phase distortion produced in a power amplification stage of a radio transmitter apparatus that is required to have a high linearity. Amplitude distortion compensation means, disposed in an intermediate frequency amplifier, has a field-effect transistor whose gate bias voltage is set near to its pinchoff voltage and compensates for amplitude distortion produced in a radio frequency amplifier. On the other hand, phase distortion compensation means having a varactor diode and a branch-line hybrid is disposed in the radio frequency amplifier so as to compensate for phase distortion produced in the radio frequency amplifier. The phase distortion compensation means can be disposed in a local frequency oscillation circuit, alternatively.

18 Claims, 24 Drawing Sheets

TRANSMITTER APPARATUS WITH LINEARIZING CIRCUIT TO COMPENSATE FOR DISTORTION IN POWER AMPLIFIER

BACKGROUND OF THE INVENTION

1. Field of the Invention

The present invention relates to a transmitter apparatus having a linearizing circuit to compensate for distortion produced in a transmission power amplifier that is required to have a high linearity, and more specifically, to a transmitter apparatus in radio communications equipment at microwave frequencies ranging up to the millimeter band, having a linearizing circuit to compensate for distortion produced in a transmission power amplifier thereof.

2. Description of the Related Art

In radio communications using microwave frequencies ranging up to the millimeter band, combined amplitude and phase modulation techniques such as 16 QAM and 64 QAM are often used to transmit multiple bits per symbol. To obtain satisfactory performance with those modern modulation techniques, a high linearity is required in a transmission power amplifier for radio communications equipment.

As illustrated in FIGS. 23(A) and 23(B), ordinary power amplifiers will exhibit some gain reduction and phase shift as their operating level comes close to the saturation power level. Phase shift that appears in their outputs may be either a lead as in FIG. 23(B) or a lag as in FIG. 23(A). Such non-linear characteristics of power amplifiers in a near-saturation range will introduce two kinds of distortion with their outputs. One is amplitude modulation distortion (hereafter "AM-AM distortion") and the other is amplitude-phase modulation distortion (hereafter "AM-PM distortion"). A conventional method to prevent amplifier outputs from being distorted is to set the operating level of the power amplifiers much lower than their saturation level. Since this conventional method forces the power amplifiers to have a high power output only for safety margin, the amplifier design results in larger sizes, greater power dissipation, and higher production costs.

To solve this problem, Japanese Patent Laid-open Publication No. 53-82110 (1978), for example, discloses a system that allows a power amplifier to operate in its near-saturation range by applying a linearizing circuit to offset the effect of distortion generated therein. FIG. 24 is a block diagram of such a conventional linearizing circuit.

This linearizing circuit is employed in an intermediate frequency (IF) or radio frequency (RF) circuit, which is located before the final power amplification stage. The circuit generates a counter-distortion signal component whose phase is shifted by 180 degrees from that of the real distortion signal component expected to be produced in the power amplifier, so that it will cancel the distortion.

More specifically, the main signal input is distributed to three signal paths (a), (b), and (c) by two hybrids 101 and 102. On the signal path (b), a distortion generator 103 having a non-linear device causes some distortion with the main signal. On the signal path (c), an attenuator 104 and a phase shifter 105 are disposed to adjust the amplitude and phase of the main signal so that their output will be equal in amplitude but 180° out-of-phase to the main signal on the signal path (b). Through a process of combining the two output signals of the paths (b) and (c) with a hybrid 106, the main signal component is eliminated and only the distortion component remains isolated. For this process, the distortion generator 103 has to be adjusted previously so that the isolated distortion component will have an adequate amplitude but inverse phase to cancel the distortion component expected to be generated in the final power amplifier. Finally, the main signal component from the signal path (a) and the distortion signal component from the hybrid 106 are combined together by a hybrid 107, while the phase difference between them is adjusted by a delay line 108.

However, such a conventional linearizing circuit is too complicated in structure and requires large-scale and costly hardware. The miniaturization and cost reduction of the power amplifier is accompanied by a large and costly linearizing circuit and, therefore, it does not directly contribute to the miniaturization and cost reduction of the transmitter equipment as a total system.

SUMMARY OF THE INVENTION

Taking the above into consideration, an object of the present invention is to provide a transmitter apparatus with a linearizing circuit that has simple structure and thus can be realized at low cost.

To accomplish the above object, according to the present invention, there is provided a transmitter apparatus having an intermediate frequency amplifier for amplifying an intermediate frequency signal, and a radio frequency amplifier for amplifying a radio frequency signal that is converted from the amplified intermediate frequency signal.

This transmitter apparatus comprises the following two major elements. One is amplitude distortion compensation means disposed in the intermediate frequency amplifier for compensating for amplitude distortion produced in the radio frequency amplifier. The other is phase distortion compensation means for compensating for phase distortion produced in the radio frequency amplifier.

To accomplish the above object, there is provided another transmitter apparatus with a linearizing circuit. This transmitter apparatus comprises the following three major elements. The first element is amplitude distortion compensation means, disposed in the intermediate frequency amplifier, for compensating for amplitude distortion produced in the radio frequency amplifier by using a field-effect transistor whose gate bias voltage is set near to a pinchoff voltage thereof. The second element is phase distortion compensation means having a varactor diode and a branch-line hybrid for compensating for phase distortion produced in the radio frequency amplifier. The third element is voltage applying means for obtaining a beat signal voltage from the amplitude distortion compensation means and applying the beat signal voltage to the varactor diode.

The above and other objects, features and advantages of the present invention will become apparent from the following description when taken in conjunction with the accompanying drawings which illustrate preferred embodiments of the present invention by way of example.

DESCRIPTION OF THE PREFERRED EMBODIMENTS

Several embodiments of the present invention will be described below with reference to the drawings.

Figure 1:
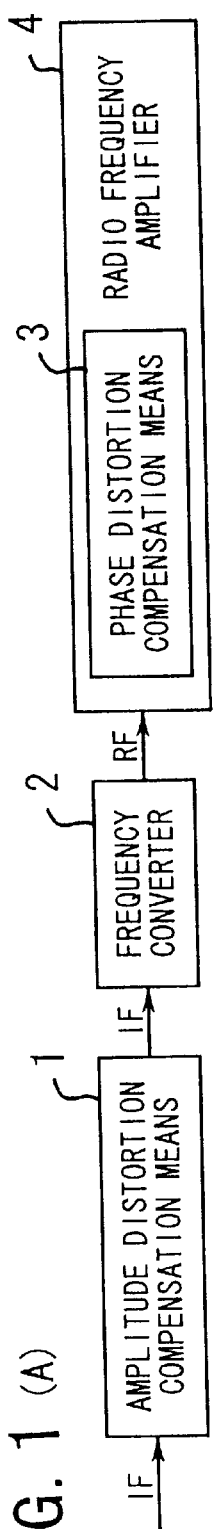
FIG. 1(A) is a diagram showing the concept of the first embodiment of the present invention.
FIG. 1(B) is a diagram showing the concept of the second embodiment of the present invention.
Figure 1:
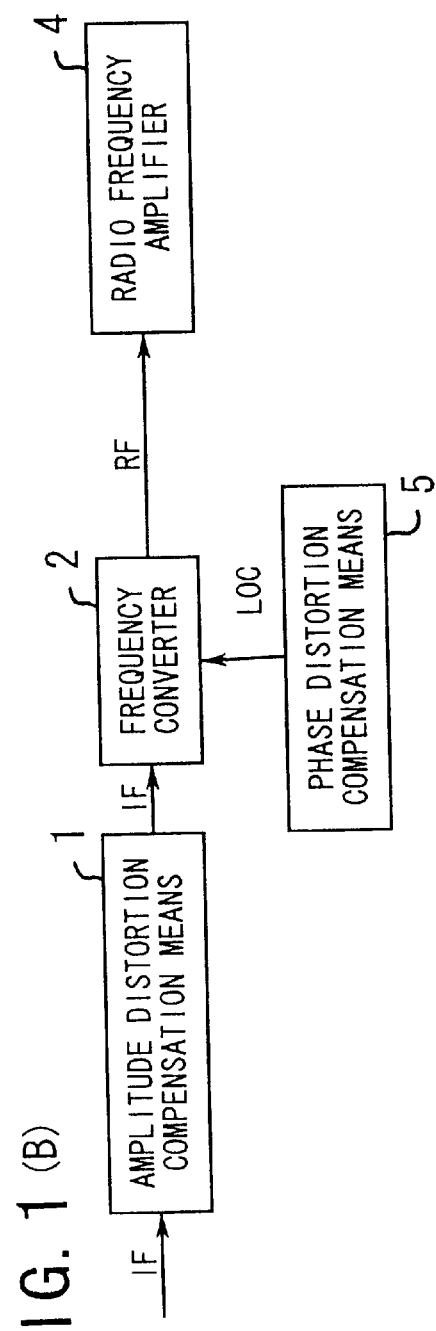

FIG. 1(A) is a conceptual view of a first embodiment of the present invention. The first embodiment comprises amplitude distortion compensation means 1 disposed in an intermediate frequency (IF) amplifier for compensating for amplitude distortion produced in a radio frequency (RF) amplifier 4, and phase distortion compensation means 3 disposed in the RF amplifier 4 for compensating for phase distortion produced in the RF amplifier 4. A frequency converter 2 in FIG. 1(A) converts the signal frequency from IF to RF.

Figure 2:
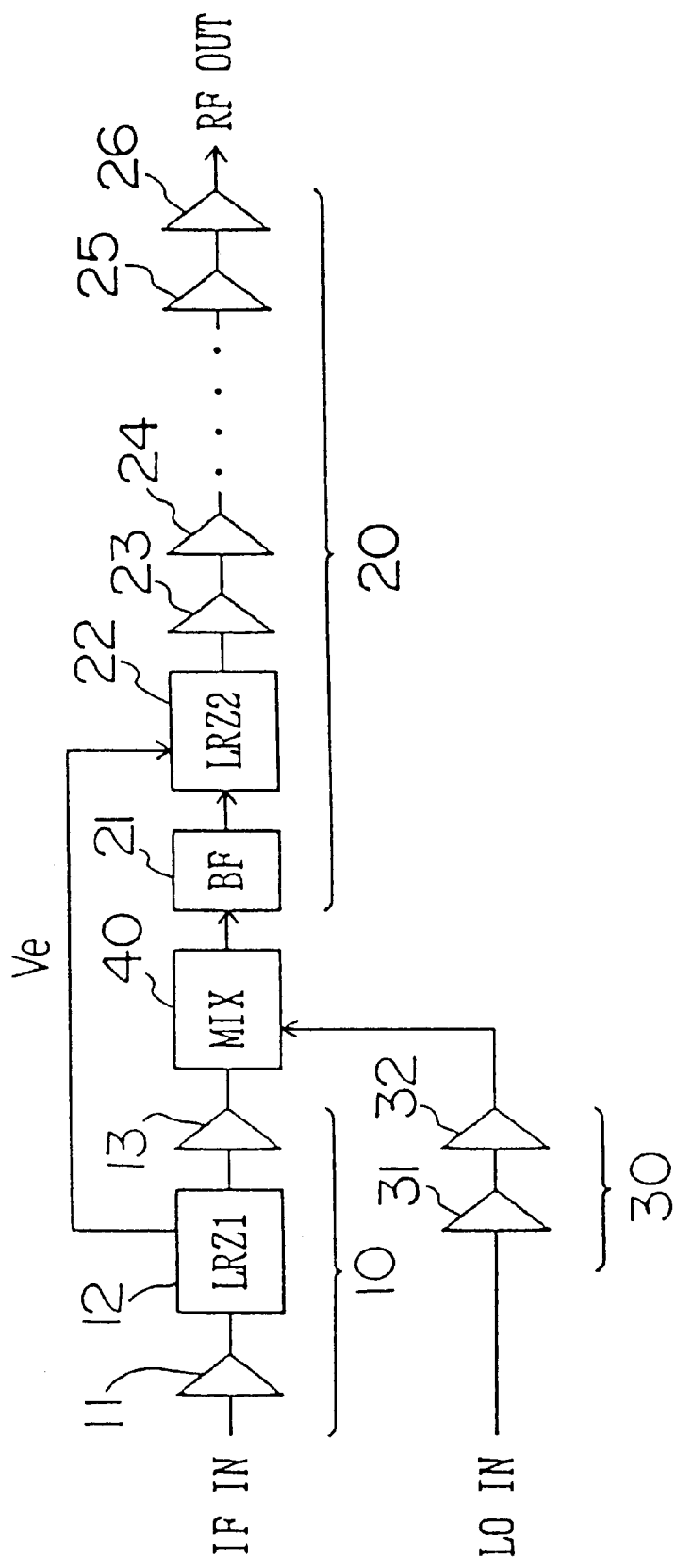
FIG. 2 is a detailed block diagram showing a first embodiment of the present invention.

FIG. 2 is a detailed block diagram for the first embodiment. When comparing this FIG. 2 with FIG. 1(A), a linearizer 12 corresponds to the amplitude distortion compensation means 1 and a linearizer 22 to the phase distortion compensation means 3.

The circuit is organized by the following four major blocks: an IF circuit 10, RF circuit 20, local frequency circuit 30, and frequency converter 40. The IF circuit 10 consists of amplifiers 11 and 13 for amplifying an IF signal input and the linearizer 12 for compensating for AM-AM distortion. The RF circuit 20 consists of a bandpass filter 21 for eliminating spurious frequency components from the RF signal, a linearizer 22 for compensating for AM-PM distortion, amplifiers 23–25 for amplifying the RF signal at a microwave frequency, and a final power amplifier 26. The local frequency circuit 30 consists of amplifiers 31 and 32 for amplifying a local frequency signal (LO IN) from a local oscillator. The frequency converter 40 converts the IF signal into the RF signal. A voltage Ve is fed from the linearizer 12 to the linearizer 22 as will be described later on.

Figure 3:
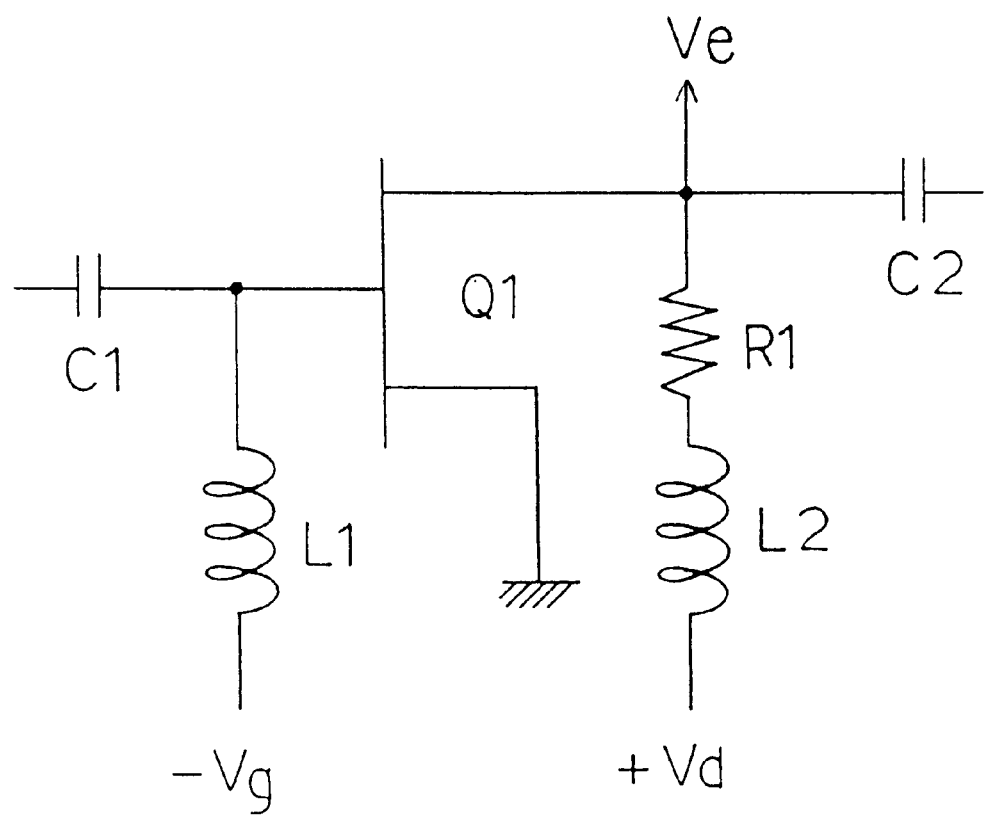
FIG. 3 is a circuit diagram showing the internal structure of a linearizer.

FIG. 3 is a circuit diagram showing the internal structure of the linearizer 12. Besides being biased by a negative gate voltage $-Vg$ through a coil L1, a field-effect transistor (FET) Q1 is supplied with an IF signal input through a coupling capacitor C1. The gate bias voltage $-Vg$ is set to a level close to the pinchoff voltage Vp of the FET Q1. The source terminal of the FET Q1 is grounded and the drain terminal is given a supply voltage $+Vd$ through a resistor R1 and a coil L2. The drain output, or the amplified IF signal, is coupled to the next stage through a capacitor C2 and also fed to the linearizer 22 named as the voltage Ve.

Figure 4:
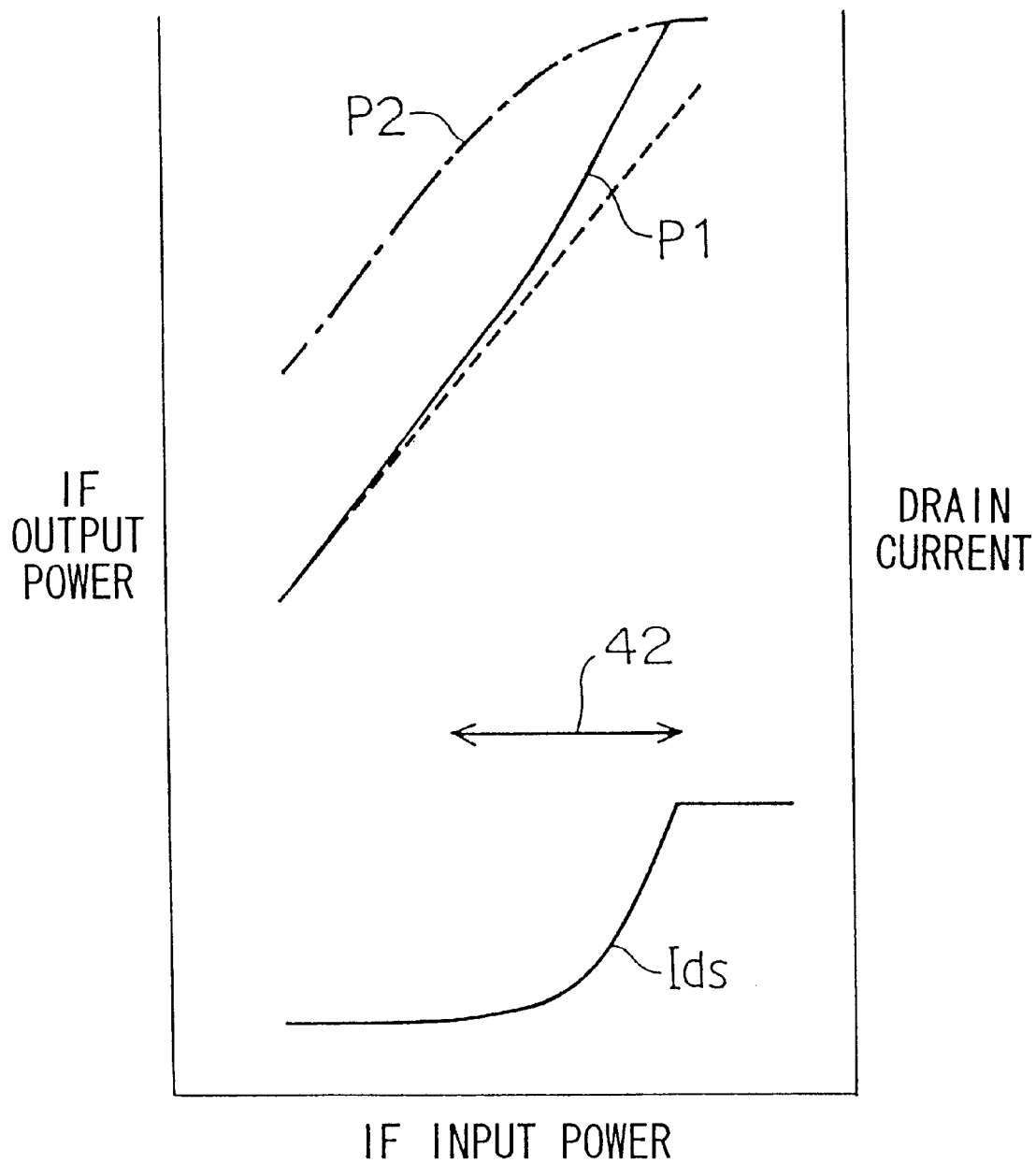
FIG. 4 is a diagram showing how the linearizer will operate.

FIG. 4 is a diagram to explain how the linearizer 12 will operate. If the FET Q1 in FIG. 3 is given a class A bias, the IF output power plot versus the IF input power will be as indicated by the line P2. That is, the circuit shows a constant gain for relatively low input levels, but the gain will decrease as the IF input power further increases. The present invention, however, sets the gate bias voltage $-Vg$ near to the pinchoff voltage Vp. In this case, the drain current Ids will exhibit a non-linear characteristic, as indicated in FIG. 4, when the input power is raised. As a result, within an input power range 42, the amplifier gain increases as indicated by the characteristic curve P1, while it decreases as indicated by the other characteristic curve P2 in the case of class A bias.

In other words, when the gate bias voltage $-Vg$ of the FET Q1 is set near to the pinchoff voltage Vp, a gain expansion effect is obtained in the input power range 42, as opposed to the characteristic of the power amplifier 26 that shows a gain reduction as the input level increases. Thus the AM-AM distortion of the power amplifier 26 can be compensated by using this gain expanding characteristic.

Incidentally, it may be possible to place the linearizer 12 not in the IF circuit 10 but in the RF circuit 20. However, lower operating frequencies allow the use of low-cost devices and also avoid the necessity of using a costly substrate with low dielectric loss, which is often required in radio frequency circuits. Therefore, in comparison with placing it in the RF circuit 20, applying the linearizer 12 to the IF circuit 10 will provide the great advantage in terms of cost saving.

Returning to FIG. 3, when the linearizer 12 is supplied with an IF input signal including a plurality of carrier frequencies, a difference frequency (or beat frequency) signal is produced at the FET Q1. This beat signal voltage, Ve, can be detected as a voltage across a resistor R1, which increases in proportion to the IF signal level. Even when the IF signal is only based on a single carrier frequency, the beat signal voltage Ve will appear at the FET Q1 as long as the IF signal is modulated. The beat signal voltage Ve is supplied to the linearizer 22 as a control signal.

Figure 5:
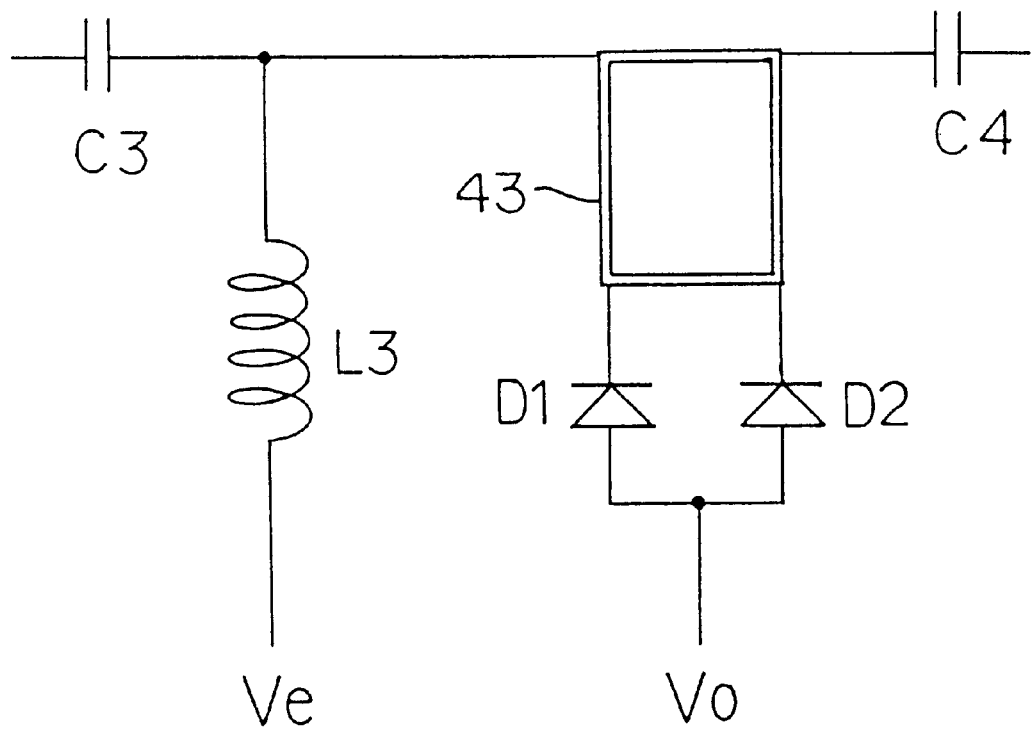
FIG. 5 is a circuit diagram showing the internal structure of another linearizer.

FIG. 5 is a circuit diagram showing the internal structure of the linearizer 22. A branch-line hybrid 43 and two varactor diodes D1 and D2 constitute a phase shifter. The voltage Ve is applied to this phase shifter via a coil L3 and the RF input signal is also fed thereto through a capacitor C3. The RF signal output from the phase shifter is supplied to the next stage through a capacitor C4. The branch-line hybrid 43 is a 90° hybrid constructed with microstrip lines. The control voltage Ve applied to the varactor diodes D1 and D2 derives their capacitance, thereby determining the amount of phase shift of the branch-line hybrid 43. That is, by selecting appropriate values for the resistor R1 in the linearizer 12 and a bias voltage Vo applied to the diodes D1 and D2, the phase shifter will produce a phase shift that corresponds to the RF input signal level and reversely affects the phase shift in the power amplifier 26. In the way described above, the linearizer 22 compensates for the AM-PM distortion in the power amplifier 26.

Next, a second embodiment of the present invention will be described below.

The concept of the second embodiment is shown in FIG. 1(B). The second embodiment comprises amplitude distortion compensation means 1 disposed in an intermediate frequency (IF) amplifier for compensating for amplitude distortion produced in a radio frequency (RF) amplifier 4, and phase distortion compensation means 5 disposed in a local oscillation circuit for compensating for phase distortion produced in the RF amplifier 4. A frequency converter 2 in FIG. 1(B) converts the signal frequency from IF to RF using a local frequency (LOC).

Figure 6:
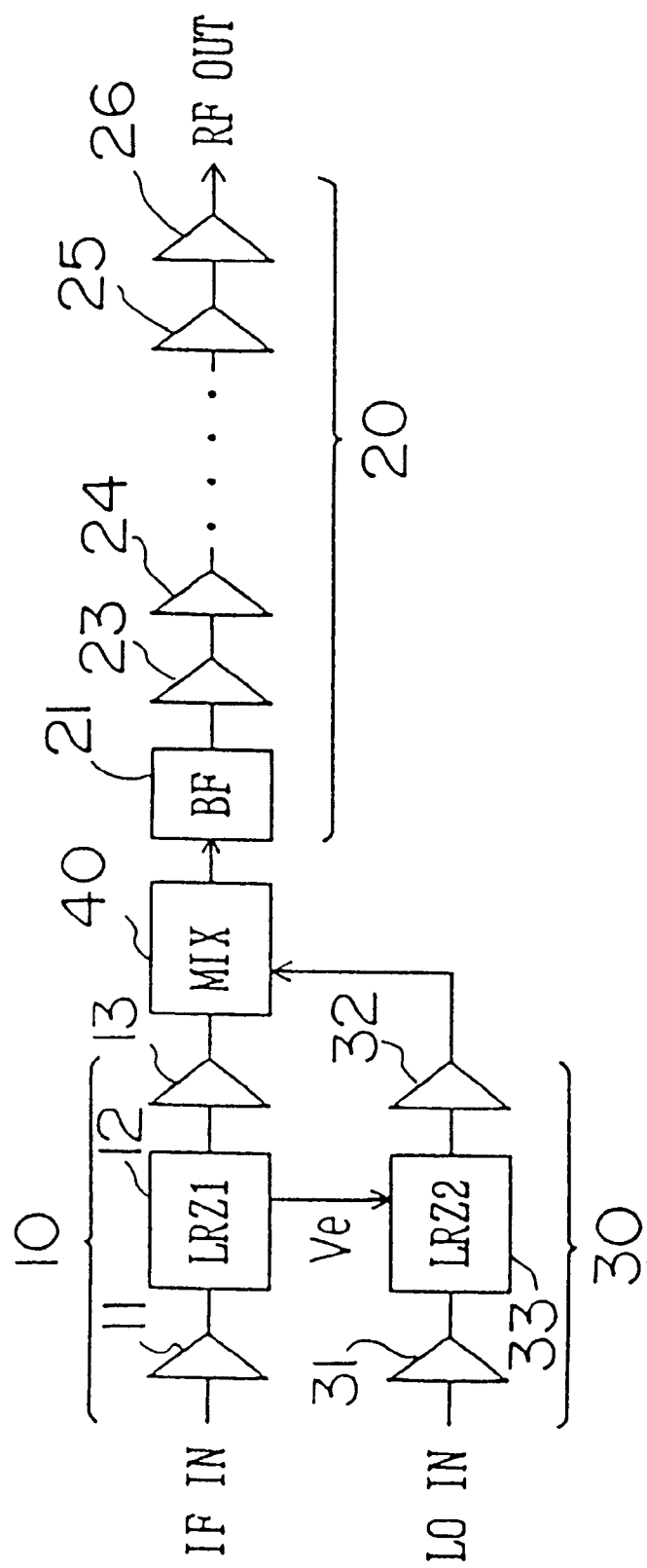
FIG. 6 is a detailed block diagram showing a second embodiment of the present invention.

FIG. 6 is a detailed block diagram showing the second embodiment. Since the structure of this embodiment is similar to that of the first embodiment, the following description will focus on its distinctive points, while maintaining consistent reference numerals for the common elements. A linearizer 12 in FIG. 6 corresponds to the amplitude distortion compensation means 1 in FIG. 1(B) and a linearizer 33 to the phase distortion compensation means 5.

Unlike the first embodiment, the linearizer 33 is placed not in the RF circuit 20 but in the local frequency circuit 30. Since the internal structure of the linearizer 33 is the same as that of the linearizer 22 in the first embodiment explained with reference to FIG. 5, the following explanation will cite the elements in FIG. 5 as part of the second embodiment.

In this structural arrangement, as the linearizer 33 varies the amount of phase shift for the local frequency signal, the main signal converted to the radio frequency by the frequency converter 40 will also vary in phase according thereto. Thus the linearizer 33 can produce an appropriate phase shift that will suppressively affect the phase shift in the power amplifier 26 according to the IF input signal level, thereby compensating for the AM-PM distortion in the power amplifier 26.

In general, the phase shifter used for the AM-PM distortion compensation causes a loss of several decibels, and the lost amplitude should be regained by some extra amplification. In the second embodiment, since the linearizer 33 is in the local frequency circuit 30, what should be amplified is a single frequency carrier signal, unlike the wideband signals handled in the RF circuit 20. This simplicity will relax the requirements to the amplifier such as the flatness of amplitude-frequency response.

Next, a third embodiment of the present invention will be described below.

Figure 7:
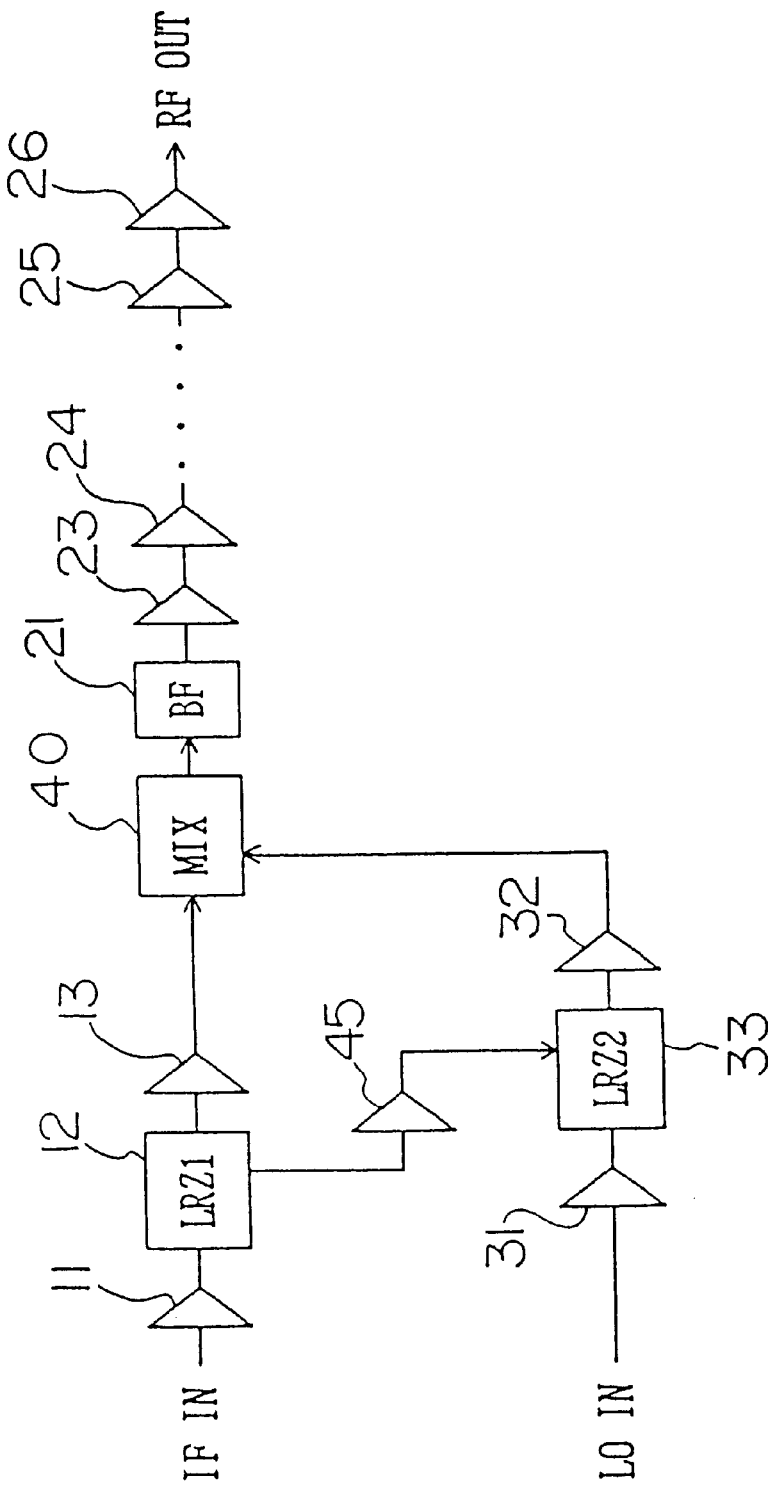
FIG. 7 is a diagram showing the structure of a third embodiment of the present invention.

FIG. 7 is a diagram showing the structure of the third embodiment. Since this structure is similar to that of the second embodiment, the following description will focus on its distinctive points, while maintaining consistent reference numerals for the common elements.

The third embodiment is characterized by a DC amplifier 45 inserted between the linearizers 12 and 33. The gain of the DC amplifier 45 is properly tuned so as to regulate the level of the control voltage sent from the linearizer 12 to the linearizer 33. This will allow the bias voltage to be supplied more accurately to the varactor diodes D1 and D2, thus optimizing the compensating operation for the AM-PM distortion.

Next, a fourth embodiment of the present invention will be described below.

Figure 8:
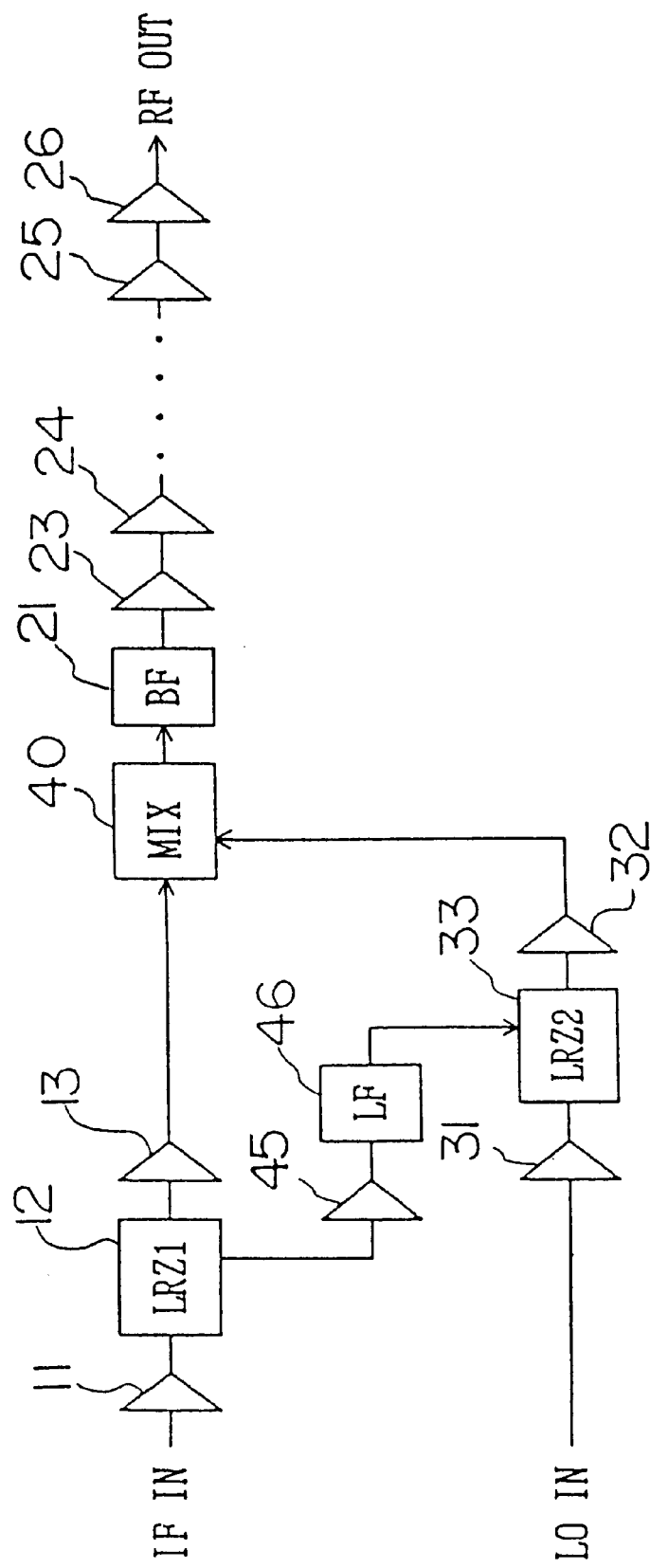
FIG. 8 is a diagram showing the structure of a fourth embodiment of the present invention.

FIG. 8 is a diagram showing the structure of the fourth embodiment. Since this structure is similar to that of the third embodiment, the following description will focus on its distinctive points, while maintaining consistent reference numerals for the common elements.

In the fourth embodiment, a lowpass filter 46 is inserted between the DC amplifier 45 and the linearizer 33.

The main transmission signal is first entered to the IF circuit, converted to an RF signal by the frequency converter 40, amplified by the RF circuit, and finally radiated from an antenna. In the frequency domain, the main transmission signal occupies a certain bandwidth that is determined by its channel capacity. Assume here that the frequency band is 70±13 MHz (i.e., 70 MHz IF carrier signal plus 13 MHz sidebands on both sides). Then the control signal for the linearizer 33 contains frequency components ranging up to 26 MHz. In addition to these original frequency components, the linearizer 33 may receive some leakage signals having 70±13 MHz frequency components of the main transmission signal. If such leakage signals reached the linearizer 33, they would be converted into some RF signals by the varactor diodes D1 and D2 in the linearizer 33 and fed to the frequency converter 40. Since it is impossible to isolate the RF output terminal perfectly from the local frequency input terminal, the above RF signals would appear at the output of the frequency converter 40. These unwanted RF signals, however, cannot be filtered out because they have the same frequency components as those of the main transmission signal.

Therefore, it is necessary to eliminate the main (70±13) MHz signals leaked from the IF circuit before they reach the linearizer 33. The aforementioned lowpass filter 46 will serve for this purpose. The cutoff frequency of the lowpass filter 46 must be set somewhere between 26 MHz and 57 MHz in this case. The wider the main signal bandwidth spreads and the lower the intermediate frequency is, the more the lowpass filter 46 is required.

Next, a fifth embodiment of the present invention will be described below.

Figure 9:
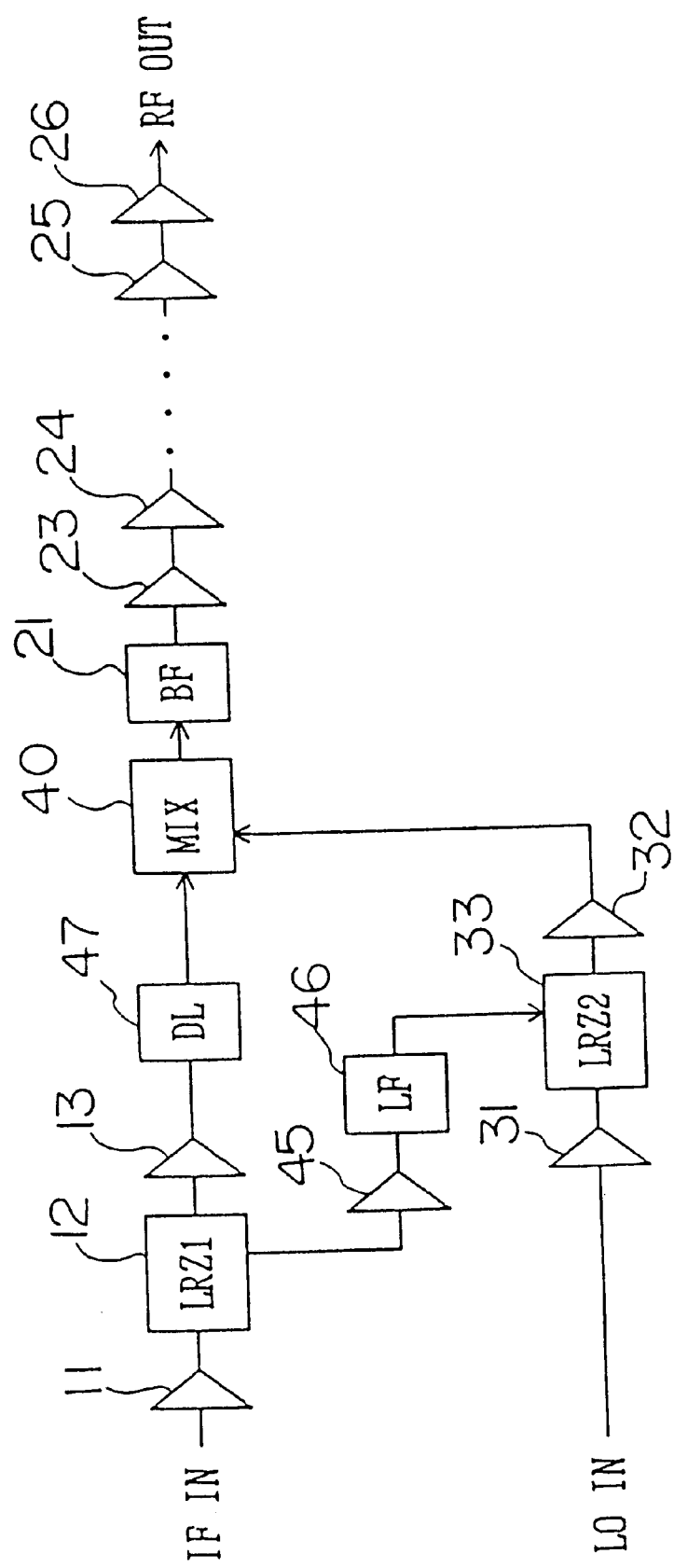
FIG. 9 is a diagram showing the structure of a fifth embodiment of the present invention.

FIG. 9 shows the structure of the fifth embodiment. Since this structure is similar to that of the fourth embodiment, the following description will focus on its distinctive points, while maintaining consistent reference numerals for the common elements.

The fifth embodiment is characterized by a delay line 47 inserted between the amplifier 13 and the frequency converter 40.

When a filter having a steep roll-off characteristics is used for the lowpass filter 46, it often causes some delay with its output signal (i.e., the control signal for the linearizer 33). This signal delay derives from the phase-lag characteristics of the filter and results in a phase difference between the main signal in the IF circuit and the local frequency signal. The resultant phase difference in the frequency converter 40 impairs the ability to compensate for the AM-PM distortion. The delay line 47 is inserted to offset that phase difference.

The amount of delay inserted to the main signal line should be adjusted according to the delay of the lowpass filter 46, so that a better compensation operation will be achieved for the AM-PM distortion.

Next, a sixth embodiment of the present invention will be described below.

Figure 10:
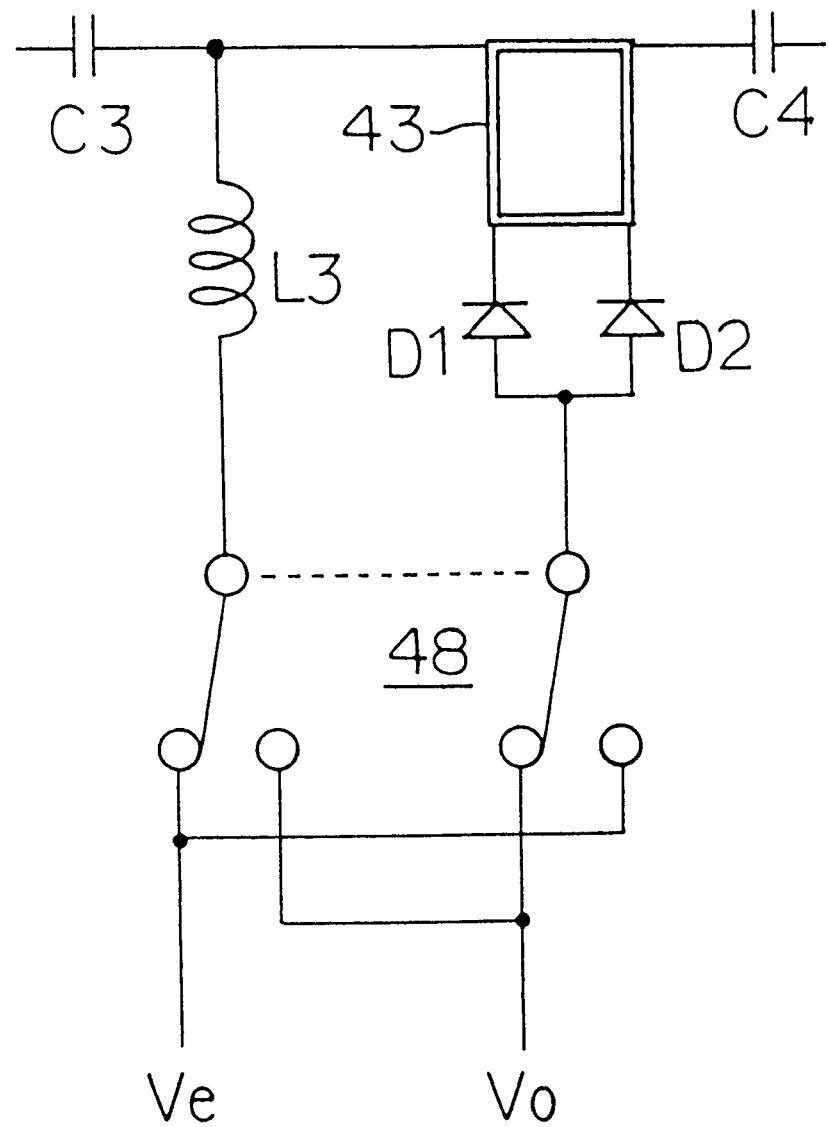
FIG. 10 is a diagram showing the structure of a linearizer used in a sixth embodiment of the present invention.

FIG. 10 is a circuit diagram of a linearizer used in the sixth embodiment. Since the structure of this embodiment is similar to that of the second embodiment, the following description will focus on its distinctive points, while maintaining consistent reference numerals for the common elements.

In the sixth embodiment, the linearizer 33 is equipped with a double-pole double-throw selection switch 48 to alternate the control voltage Ve and the bias voltage Vo applied to the varactor diodes D1 and D2. This voltage alternating operation provides the same effect as reversing the varactor diodes D1 and D2. That is, the direction of the diodes can be electrically changed, thus enabling the linearizer 33 to adapt to both of the phase-lag and phase-lead (i.e., the AM-PM distortion) that may occur in the power amplifier 26.

Lastly, a seventh embodiment of the present invention will be described below.

Figure 11:
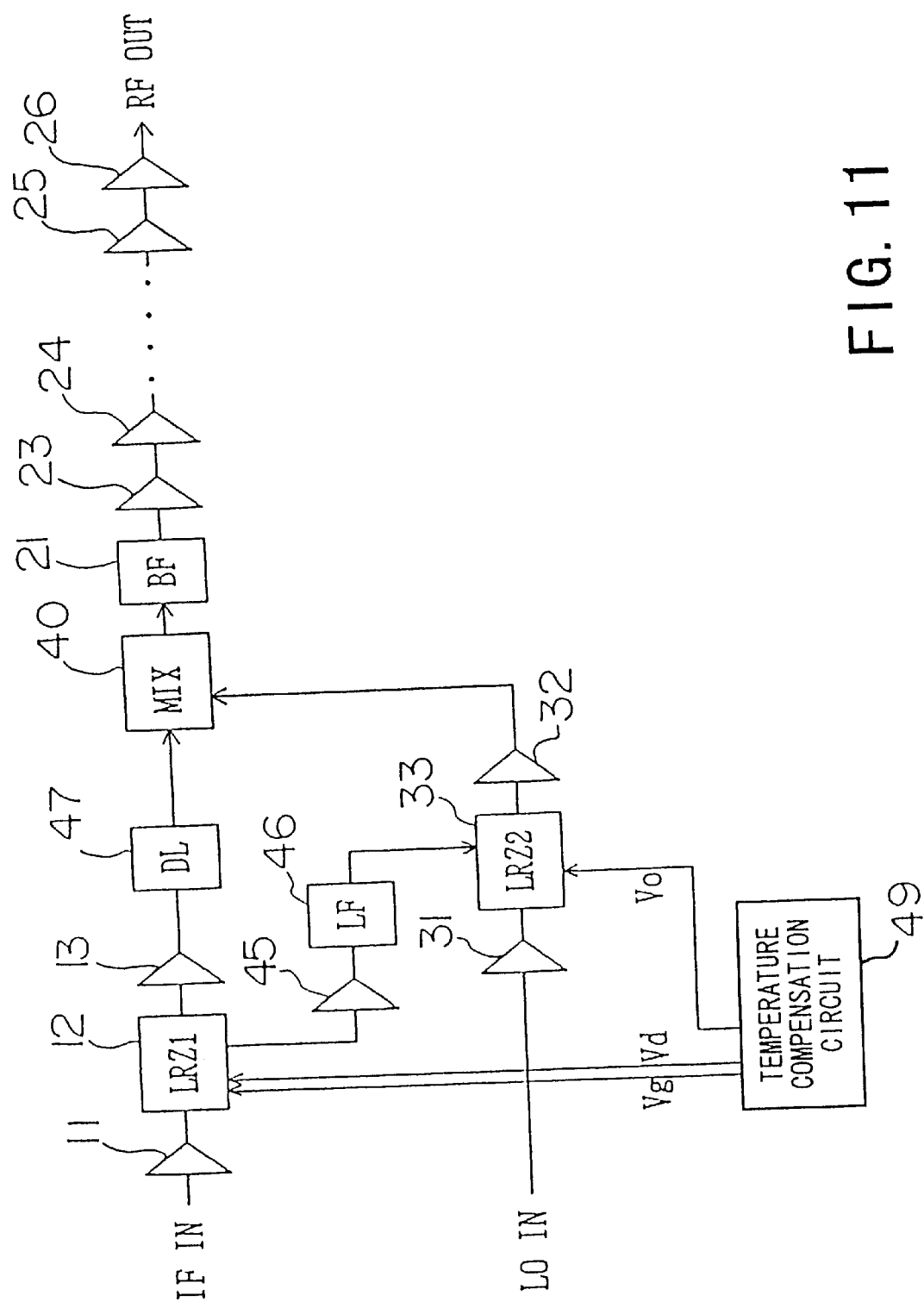
FIG. 11 is a diagram showing the structure of a seventh embodiment of the present invention.

FIG. 11 shows the structure of the seventh embodiment. Since this structure is similar to that of the fifth embodiment, the following description will focus on its distinctive points, while maintaining consistent reference numerals for the common elements.

The seventh embodiment employs a temperature compensation circuit 49 having a temperature sensor integrated therein. The temperature compensation circuit 49 adjusts the gate voltage Vg and drain voltage Vd of the linearizer 12 as well as the bias voltage Vo for the varactor diodes in the linearizer 33, according to a measured value of the temperature sensor. This compensates for the effect of temperature drift, thus allowing the linearizers 12 and 33 to be adaptive to any temperature change.

Next, an eighth embodiment of the present invention will be described below.

Most radio transmitters employ an automatic transmission power control (ATPC) circuit for controlling their transmission output power according to the reception signal conditions, as well as having an automatic output level control (ALC) circuit for regulating the transmission output. The following eighth to fifteenth embodiments will show how the present invention is applied to the radio transmitters equipped with such ALC and ATPC circuits.

Figure 12:
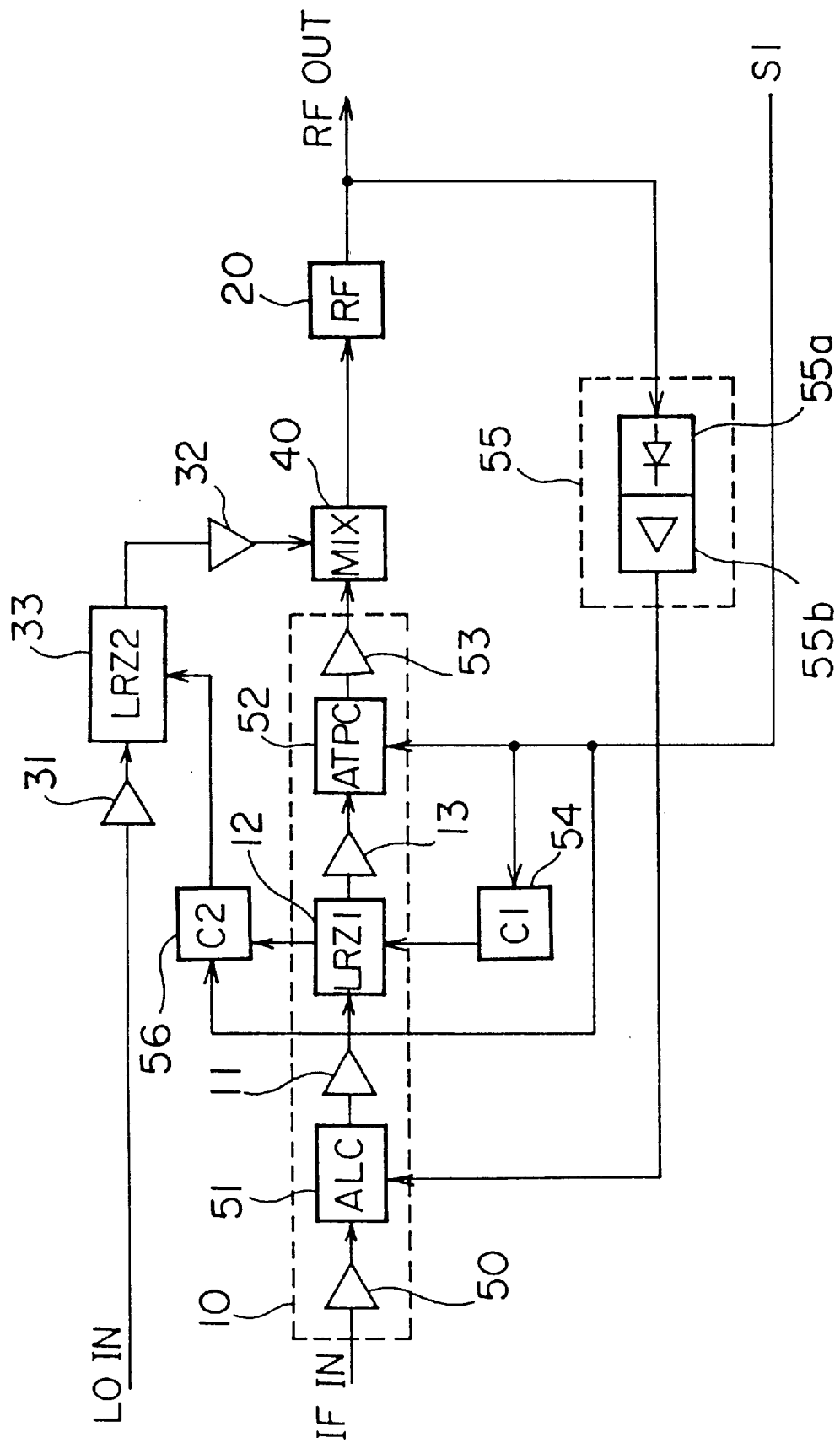
FIG. 12 is a diagram showing the structure of an eighth embodiment of the present invention.

FIG. 12 shows the structure of the eighth embodiment of the present invention. Since this embodiment has basically the same structure as that of the third embodiment shown in FIG. 7, the following description will focus on its distinctive points, while maintaining consistent reference numerals for the common elements.

Compared with the third embodiment, the IF circuit 10 in the eighth embodiment has more components: an amplifier 50, an ALC circuit 51, an ATPC circuit 52, and an amplifier 53. The ALC circuit 51 is coupled with an ALC control circuit 55 consisting of a detector 55a and a DC amplifier 55b. The ALC control circuit 55 is coupled to the output of the RF circuit 20 to detect its RF signal level for use in the ALC circuit 51 as a control voltage. The ALC circuit 51 is a variable attenuator, whose attenuation level is determined by the control voltage from the ALC control circuit 55, for suppressing the fluctuation of the RF output by varying the degree of attenuation according to the actual RF output level.

The ATPC circuit 52 sets the transmission power level by a control signal S1 sent from the receiver side to indicate the field strength of reception signals. In the present embodiment, it is assumed that the signal S1 is a binary digital signal, where the state "0" commands the ATPC circuit 52 to set the transmission power to "low" and the state "1" to "high." Although such an ATPC circuit is disposed at an earlier stage than a linearizing circuit in conventional transmitter apparatus, the present invention places the ATPC circuit 52 after the linearizer 12.

When the transmission power is set to "high" in the ATPC circuit 52, the distortion produced in the RF circuit 20 will be compensated by the linearizers 12 and 33. On the other hand, when the transmission power is set to "low," those linearizers will have the opposite effect. That is, the linearizers 12 and 33 continue to work as usual despite of no distortion being produced in the RF circuit 20, thus causing their counter-distortion signal components to deform the RF output signal. To prevent such a side effect from happening, the present invention employs a control circuit (C1) 54 and a control circuit (C2) 56 for respectively limiting the compensatory operations of the linearizer 12 and the linearizer 33 while the "low" transmission power is commanded. Upon reception of the control signal S1 being driven to "0" for the low transmission power, the control circuit (C1) 54 reduces the negative gate bias −Vg for the FET Q1 in the linearizer 12, so that the gate voltage be shifted away from the pinchoff voltage. Similarly, the control circuit 56 recognizes a command for the low transmission power and reduces the voltage Ve to be supplied to the linearizer 33 so as to cut down the phase shift amount.

Figure 13:
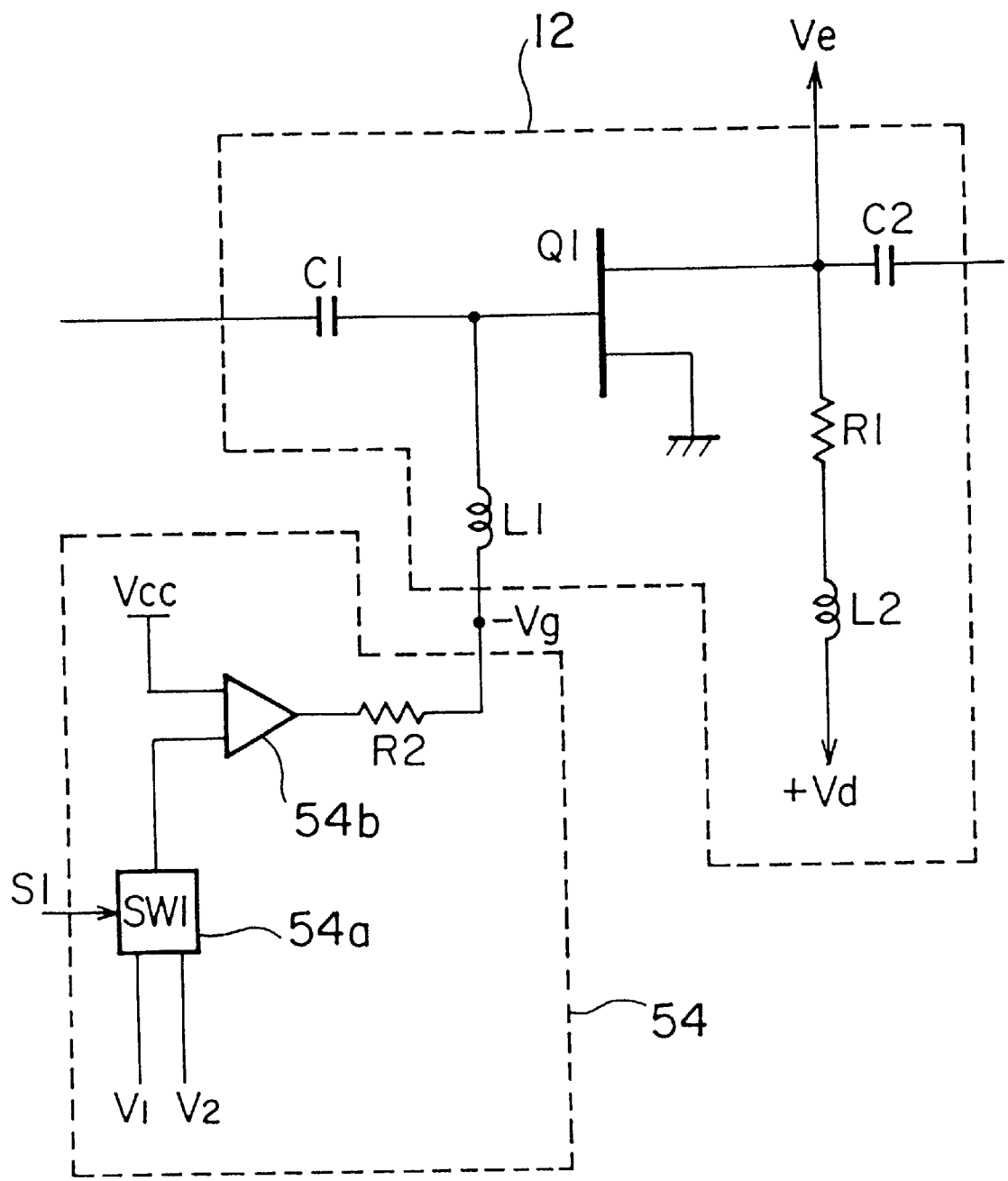
FIG. 13 is a circuit diagram showing the internal structure of a control circuit for the eighth embodiment.

FIG. 13 is a circuit diagram showing the internal structure of the control circuit 54. FIG. 13 includes the linearizer 12 for reference, which is identical to what is seen in FIG. 3.

The control circuit 54 consists of an analog switch 54a, a DC amplifier 54b, and a resistor R2. The analog switch 54a selects either one of two voltages V1 and V2 by the control signal S1. Passing through the DC amplifier 54b and the resistor R2, the selected voltage is supplied to the linearizer 12 as the gate bias voltage −Vg. With the appropriately selected voltages V1 and V2, the control circuit 54 increases the gate bias voltage −Vg so that the gate voltage be adjusted near to the pinchoff voltage Vp for the high transmission power setting or, in turn, it reduces the gate bias voltage −Vg so that the gate voltage be shifted away from the pinchoff voltage Vp for the low transmission power setting.

Figure 14:
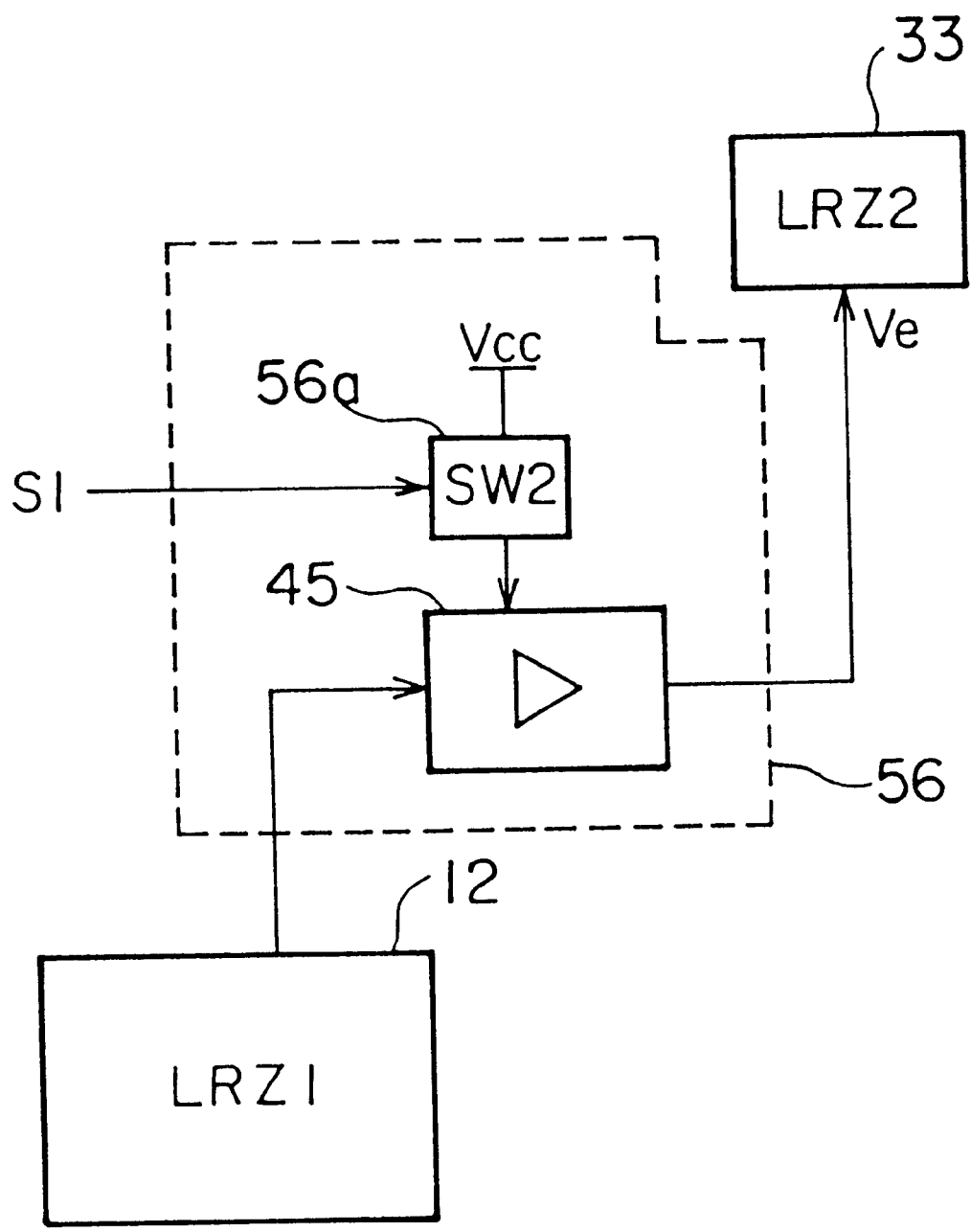
FIG. 14 is a circuit diagram showing the internal structure of another control circuit for the eighth embodiment.

FIG. 14 is a circuit diagram showing the internal structure of the control circuit 56.

The control circuit 56 consists of a DC amplifier 45 and an analog switch (SW2) 56a. Disposed between the supply voltage Vcc and the DC amplifier 45, the analog switch 56a interrupts the Vcc power to the DC amplifier 45 according to the control signal S1. When the transmission power is set to "high," the analog switch 56a activates the DC amplifier 45 by providing the supply voltage Vcc thereto, thus generating the control voltage Ve for the linearizer 33. On the other hand, when the transmission power is set to "low," the analog switch 56a disables the DC amplifier 45 by shutting off the supply voltage Vcc and thus inhibits the control voltage Ve from being supplied to the linearizer 33.

The above-described circuit structure avoids the problem of undesired deformation of the RF output signal due to the continued operations of the linearizers 12 and 33 in spite of no distortion produced in the RF circuit 20.

Incidentally, the gain of the linearizer 12 varies as the gate bias voltage −Vg changes. This variation of linearizer gain will bring a deterioration of the carrier-to-noise ratio (C/N) in such a configuration that the linearizing circuit is located after the ATPC circuit, as is in the conventional transmitter apparatus. In the present invention, however, the deterioration of the C/N ratio can be avoided because the ATPC circuit 52 is placed after the linearizer 12.

Next, a ninth embodiment of the present invention will be described below. This ninth embodiment has basically the same structure as that of the eighth embodiment shown in FIG. 12 except for the internal structure of the control circuit 54. Thus, the following description will focus on the distinctive points of the ninth embodiment, maintaining consistent reference numerals for the common elements.

Figure 15:
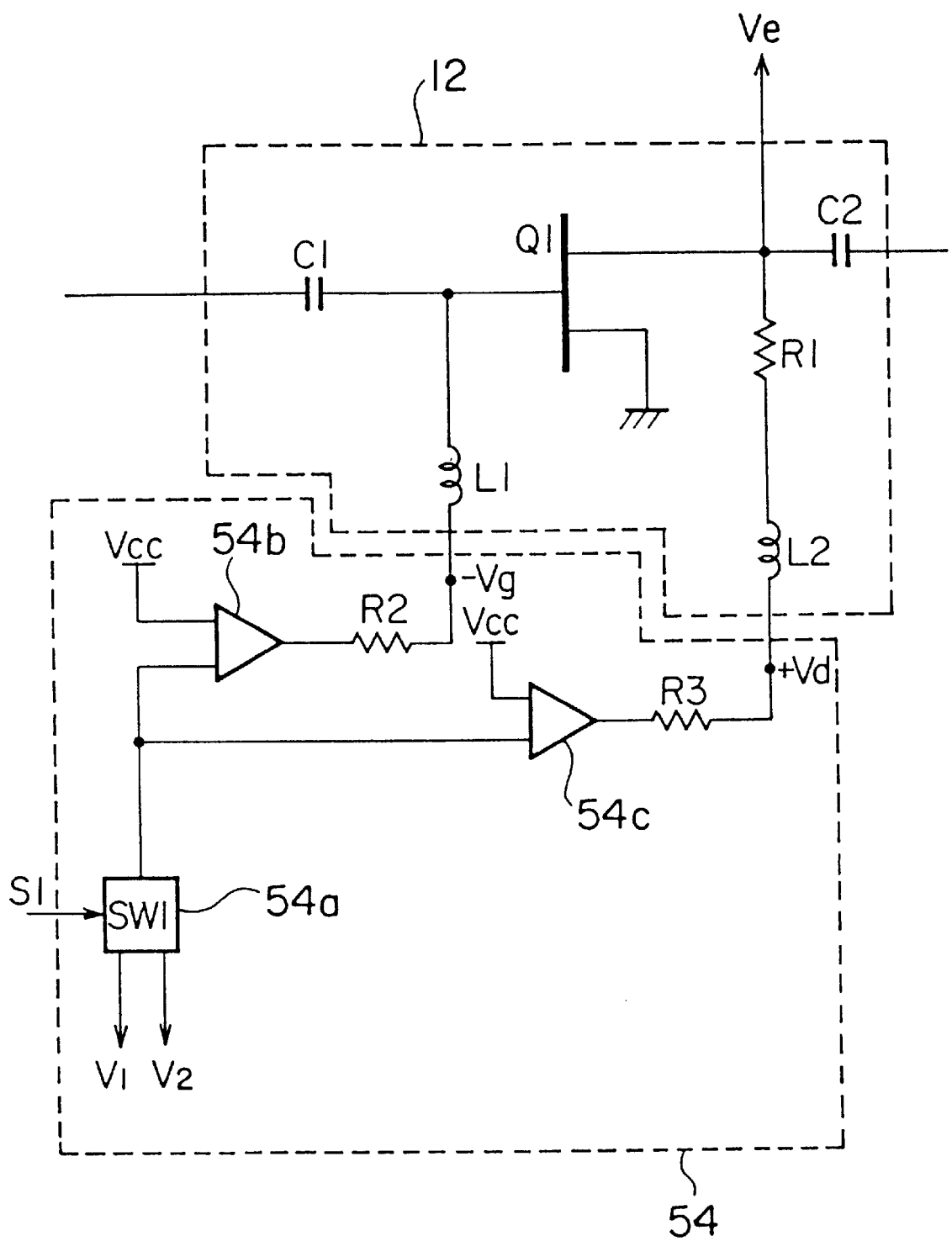
FIG. 15 is a circuit diagram showing the internal structure of a control circuit for a ninth embodiment.

FIG. 15 is a circuit diagram showing the internal structure of the control circuit 54 in the ninth embodiment, which has a DC amplifier 54c and a resistor R3 in addition to the components introduced in the eighth embodiment. The input of the DC amplifier 54c is connected to the analog switch (SW1) 54a, and the output is connected via the resistor R3 to the coil L2 in the linearizer 12. Namely, a DC voltage that varies according to the control signal S1 is supplied to the drain of the FET Q1. This configuration allows the drain voltage to fit with the gate voltage of the FET Q1 which may be adjusted near to or away from the pinchoff voltage for the high and low transmission power settings, respectively.

Next, a tenth embodiment of the present invention will be described below. This tenth embodiment has basically the same structure as that of the eighth embodiment shown in FIG. 12 except for the internal structure of the control circuit 56. Thus, the following description will focus on the distinctive points of the tenth embodiment, maintaining consistent reference numerals for the common elements.

Figure 16:
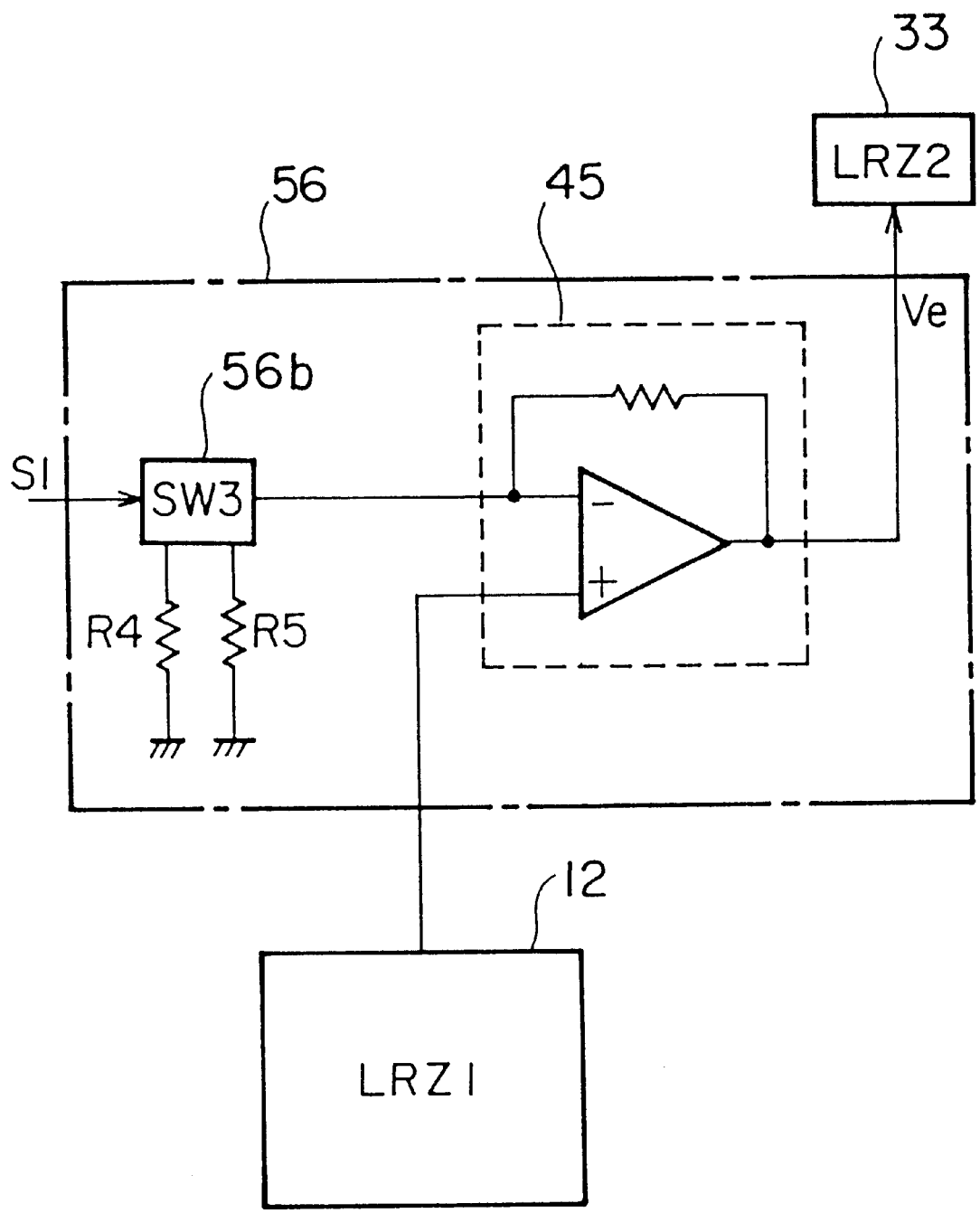
FIG. 16 is a circuit diagram showing the internal structure of a control circuit for a tenth embodiment.

FIG. 16 is a circuit diagram showing the internal structure of the control circuit 56 in the tenth embodiment, where an analog switch (SW3) 56b is connected to the negative input terminal of the DC amplifier 45. According to the control signal S1, the analog switch 56b selectively connects a resistor R4 or R5 to the input of the DC amplifier 45, while the other ends of the resistors R4 and R5 are grounded. This circuit configuration enables the DC amplifier 45 to operate with two different gains defined by the resistors R4 and R5 whose resistance values are appropriately selected. When the transmission power is set to "high," the amplifier gain is raised to increase the phase shift produced in the linearizer 33. When the transmission power is set to "low," the amplifier gain is reduced to decrease the phase shift produced in the linearizer 33.

Next, an eleventh embodiment of the present invention will be described below.

Figure 17:
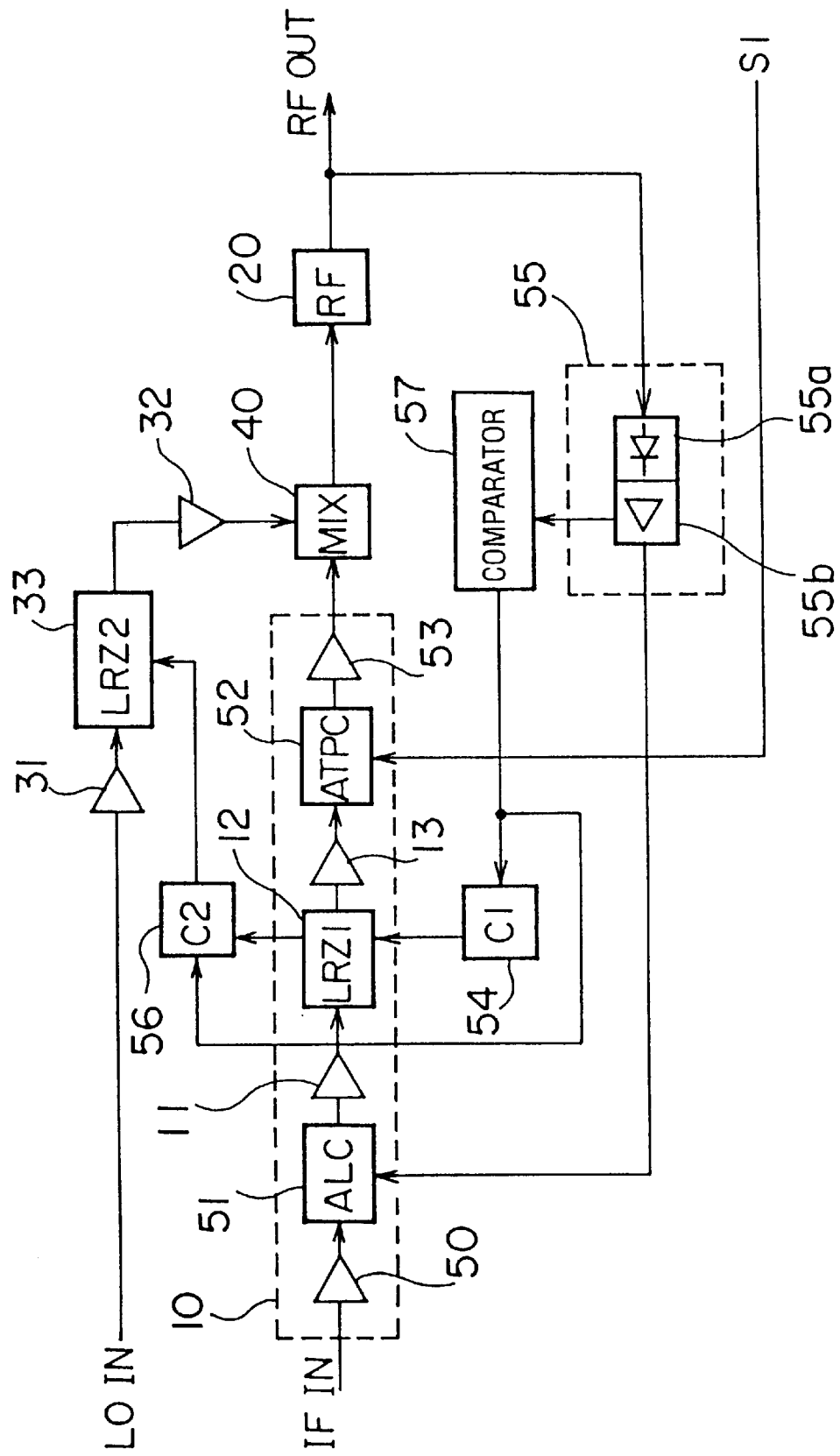
FIG. 17 is a diagram showing the structure of an eleventh embodiment of the present invention.

FIG. 17 shows the structure of the eleventh embodiment. Since this eleventh embodiment has basically the same structure as that of the eighth embodiment shown in FIG. 12, the following description will focus on the distinctive points, while maintaining consistent reference numerals for the common elements.

The eleventh embodiment employs a comparator 57 and applies its output to the control circuits 54 and 56 as their control signals, instead of directly supplying the control signal S1 to them. The DC amplifier 55b in the ALC control circuit 55 provides the comparator 57 with the analog transmission output voltage to make a comparison with a predetermined threshold. The comparator output is a digital signal which indicates a low transmission power when it is "0" or a high transmission power when it is "1," just as the control signal S1 does. Accordingly, the control circuits 54 and 56 in the eleventh embodiment works completely in the same way as in the eighth embodiment.

The above-described eleventh embodiment can also be applied to the ninth and tenth embodiments.

Next, a twelfth embodiment of the present invention will be described below.

Figure 18:
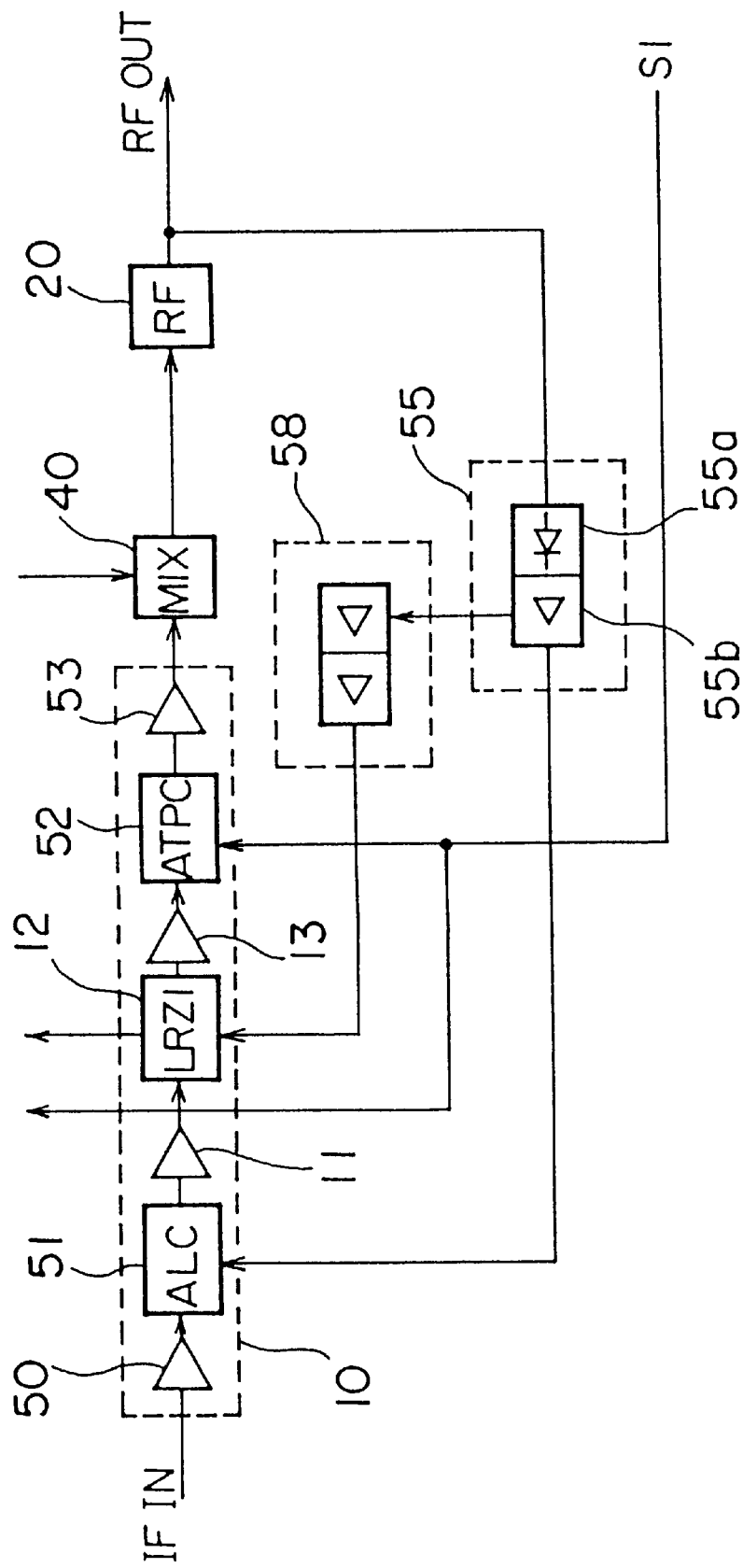
FIG. 18 is a diagram showing the structure of a twelfth embodiment of the present invention.

FIG. 18 shows the structure of the twelfth embodiment. Since this twelfth embodiment has basically the same structure as that of the eighth embodiment shown in FIG. 12, the following description will focus on the distinctive points, while maintaining consistent reference numerals for the common elements. Although FIG. 18 omits some constituents such as the linearizer 33 and control circuit 56, they do exist as in the eighth embodiment.

Instead of having the control circuit 54, the twelfth embodiment employs a DC amplifier 58 to control the linearizer 12. The output of the DC amplifier 55b in the ALC control circuit 55 is supplied to the linearizer 12 after amplification by the DC amplifier 58. The gate bias voltage −Vg derives directly from the transmission output voltage supplied by the DC amplifier 55b.

The above-described twelfth embodiment can also be applied to the ninth to eleventh embodiments.

Next, a thirteenth embodiment of the present invention will be described below.

Figure 19:
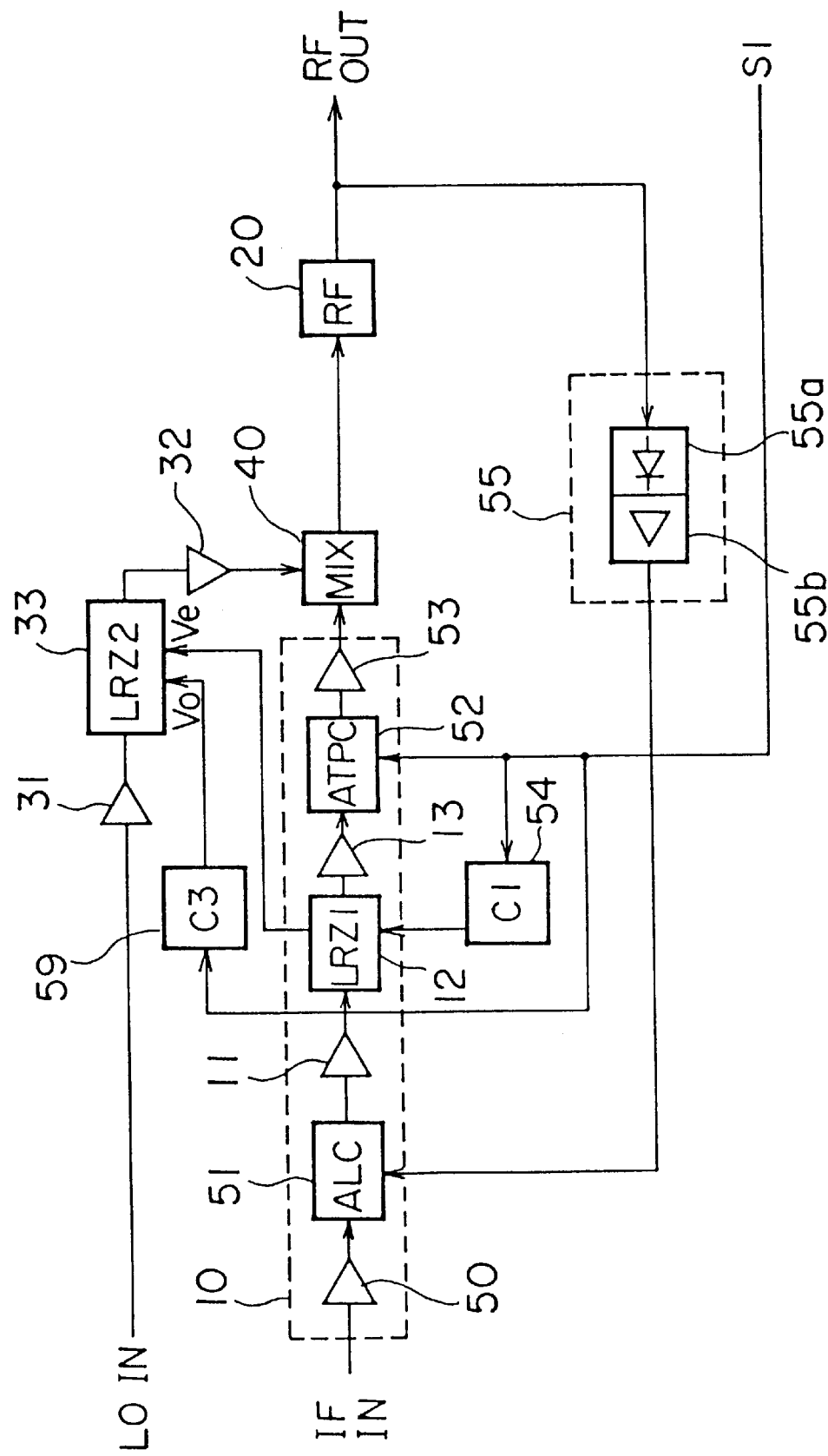
FIG. 19 is a diagram showing the structure of a thirteenth embodiment of the present invention.

FIG. 19 shows the structure of the thirteenth embodiment. Since this embodiment has basically the same structure as that of the eighth embodiment shown in FIG. 12, the following description will focus on the distinctive points, while maintaining consistent reference numerals for the common elements.

The thirteenth embodiment employs a control circuit (C3) 59 to adjust the bias voltage Vo for the linearizer 33 according to the control signal S1, while the control voltage Ve is directly supplied from the linearizer 12 to the linearizer 33. The configuration of the control circuit (C1) 54 is the same as that in the eighth embodiment.

Figure 20:
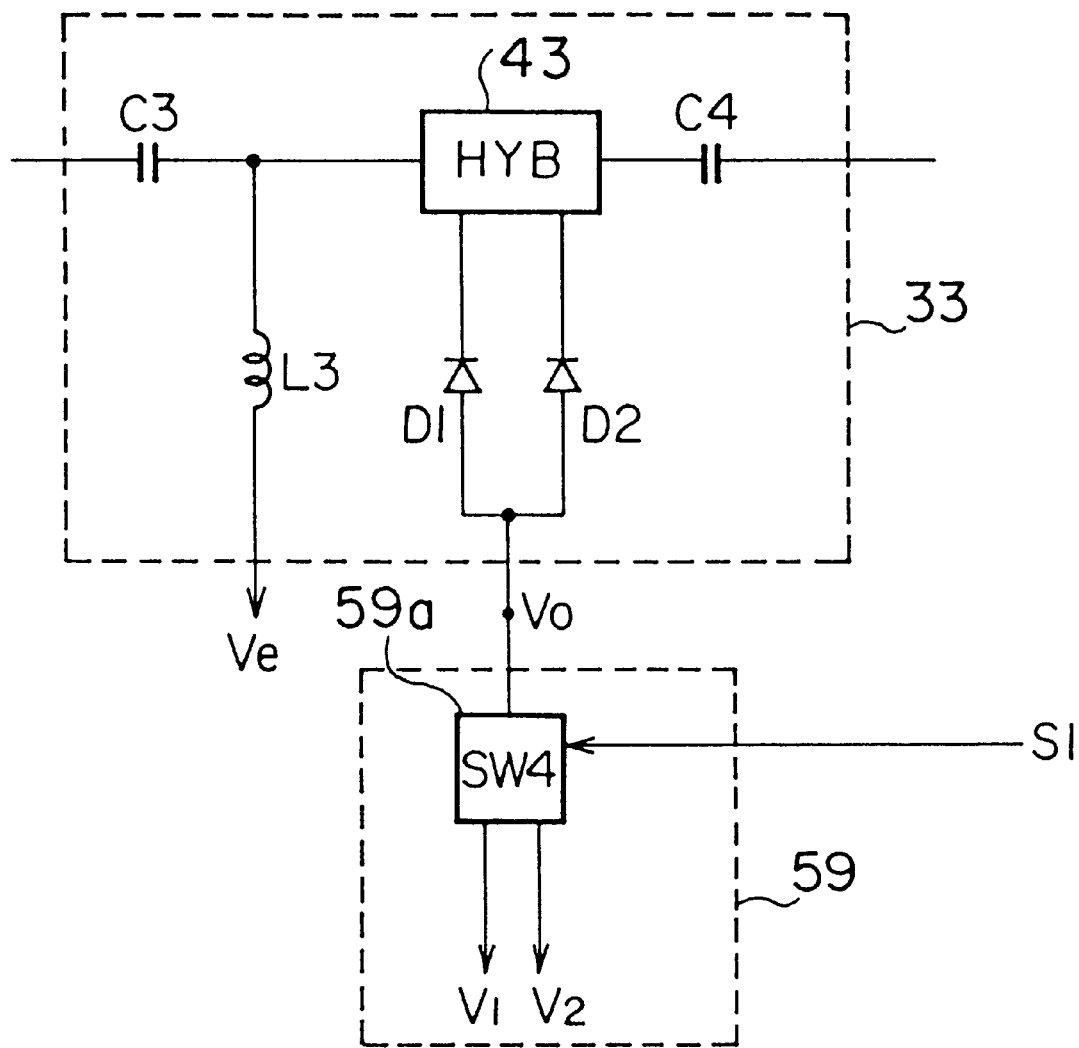
FIG. 20 is a circuit diagram showing the internal structure of a control circuit for the thirteenth embodiment.

FIG. 20 is a circuit diagram that shows the internal structure of the control circuit 59 as well as including the linearizer 33 for reference, which is what is previously explained in FIG. 5.

The control circuit 59 is realized by an analog switch (SW4) 59a, which selects either one of two voltages V1 and V2 by the control signal S1. The selected voltage, V1 or V2, is supplied to the linearizer 33 as its bias voltage Vo. This configuration allows the phase shift in the linearizer 33 to be varied not by the control voltage Ve but by the bias voltage Vo, adaptively to the change of the transmission power.

The above-described thirteenth embodiment can also be applied to the ninth, eleventh, and twelfth embodiments.

Next, a fourteenth embodiment of the present invention will be described below.

Figure 21:
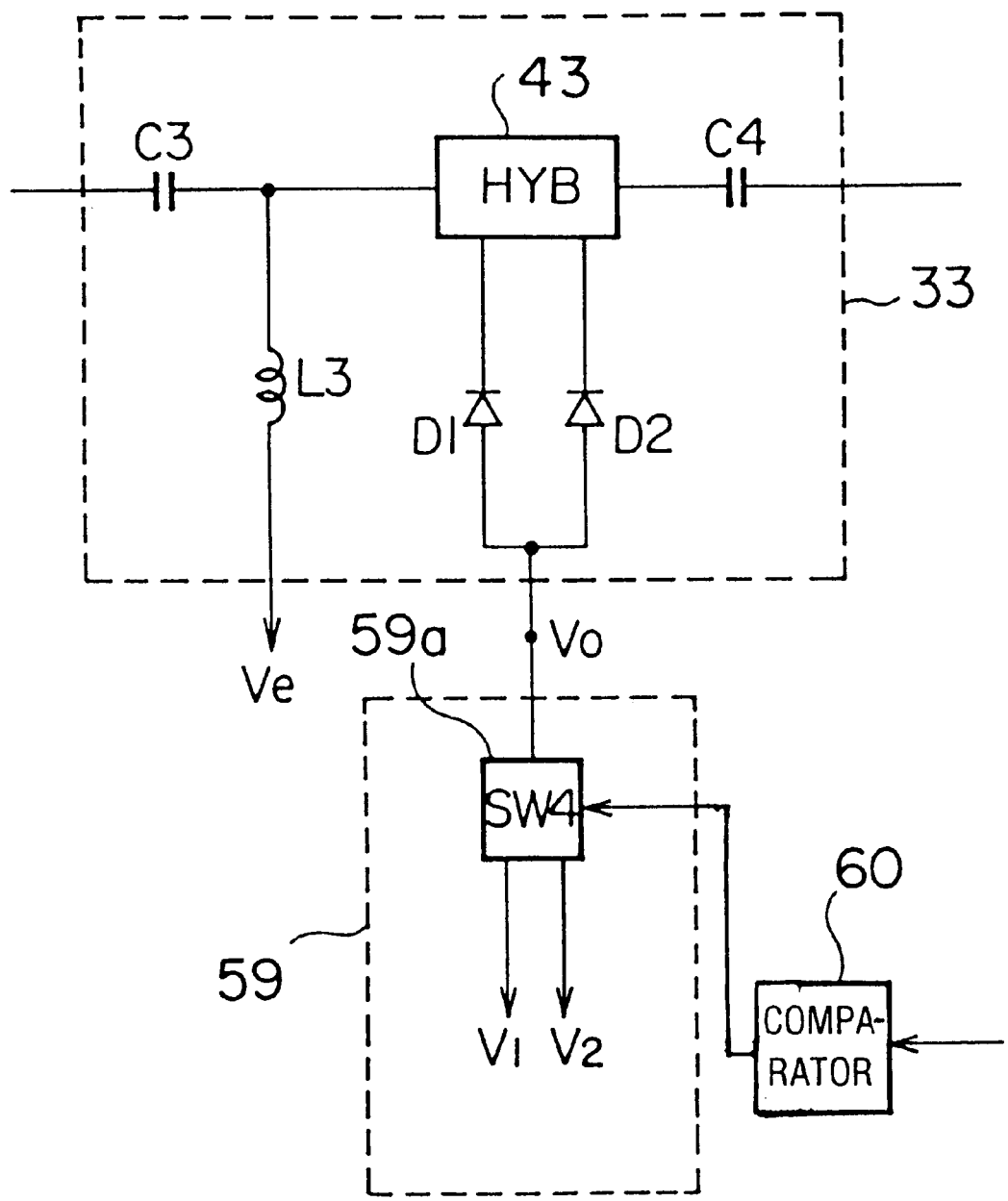
FIG. 21 is a diagram showing the internal structure of a control circuit for a fourteenth embodiment.

FIG. 21 shows the structure of the fourteenth embodiment, which is actually a combination of the thirteenth embodiment (FIGS. 19 and 20) and the eleventh embodiment (FIG. 17). Specifically, a comparator 60 monitors the transmission output level indicated by the ALC control circuit 55 to produce a signal that will work in the same way as the control signal S1 does, and this signal controls the analog switch 59a.

The above-described fourteenth embodiment can also be applied to the ninth, eleventh, and twelfth embodiment.

Next, a fifteenth embodiment of the present invention will be described below.

Figure 22:
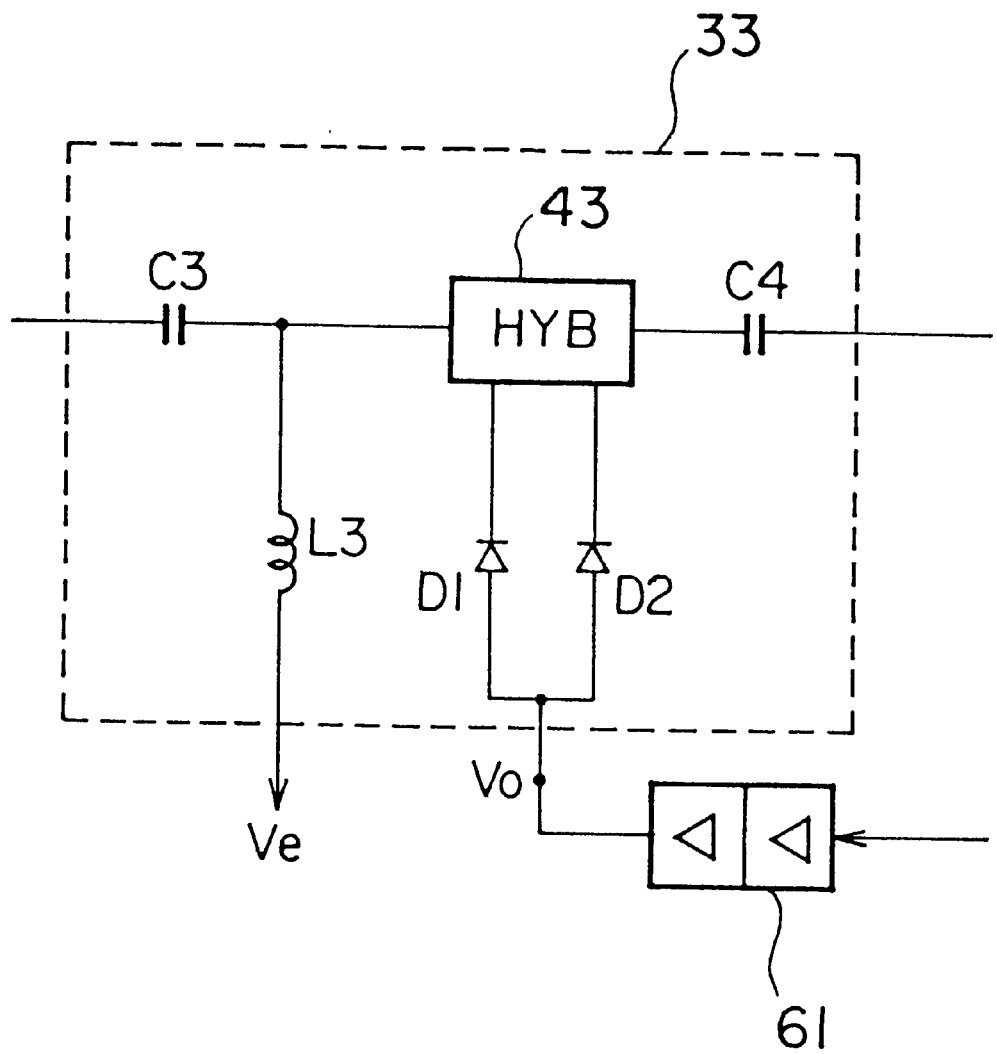
FIG. 22 is a diagram showing the internal structure of a control circuit for a fifteenth embodiment of the present invention.
Figure 23:
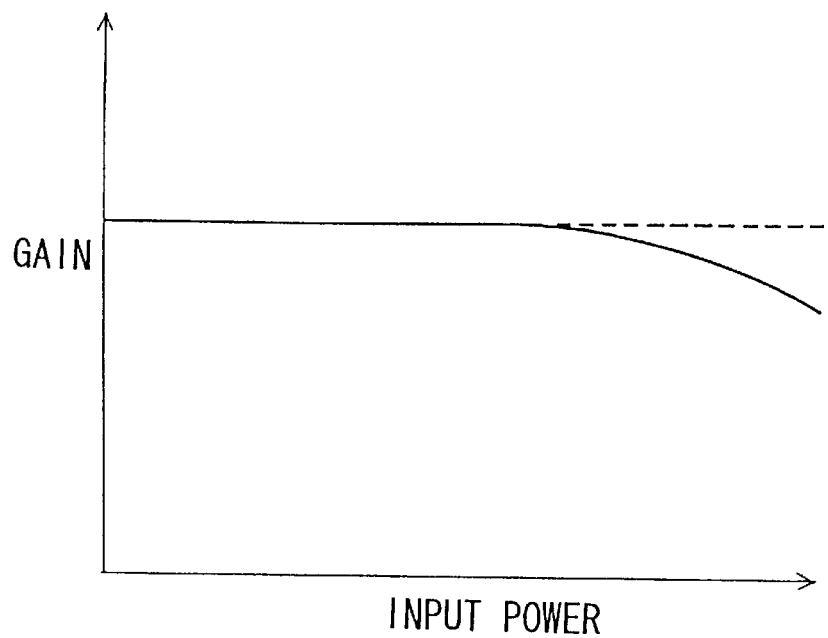
FIG. 23(A) is a diagram showing a gain characteristics of a power amplifier when its input power level is varied.
FIG. 23(B) is a diagram showing a phase characteristics of a power amplifier when its input power level is varied.
Figure 23:
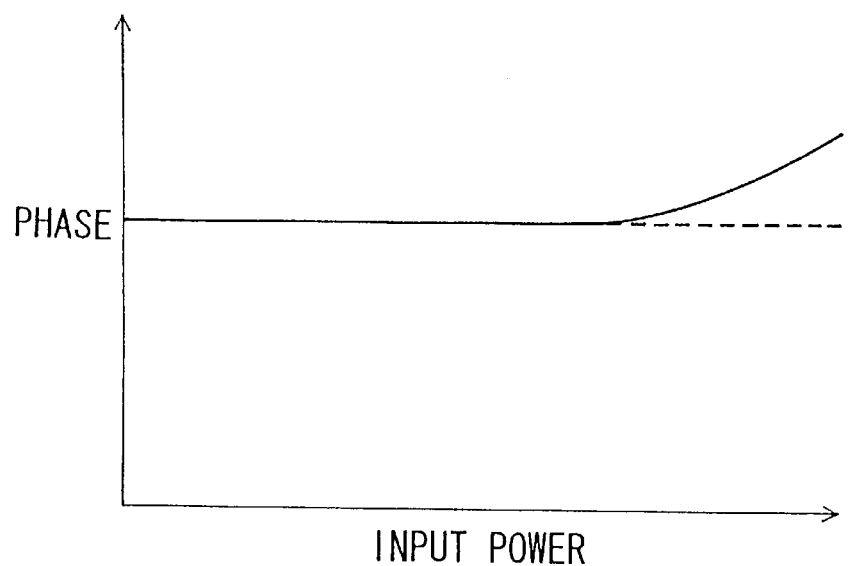
Figure 24:
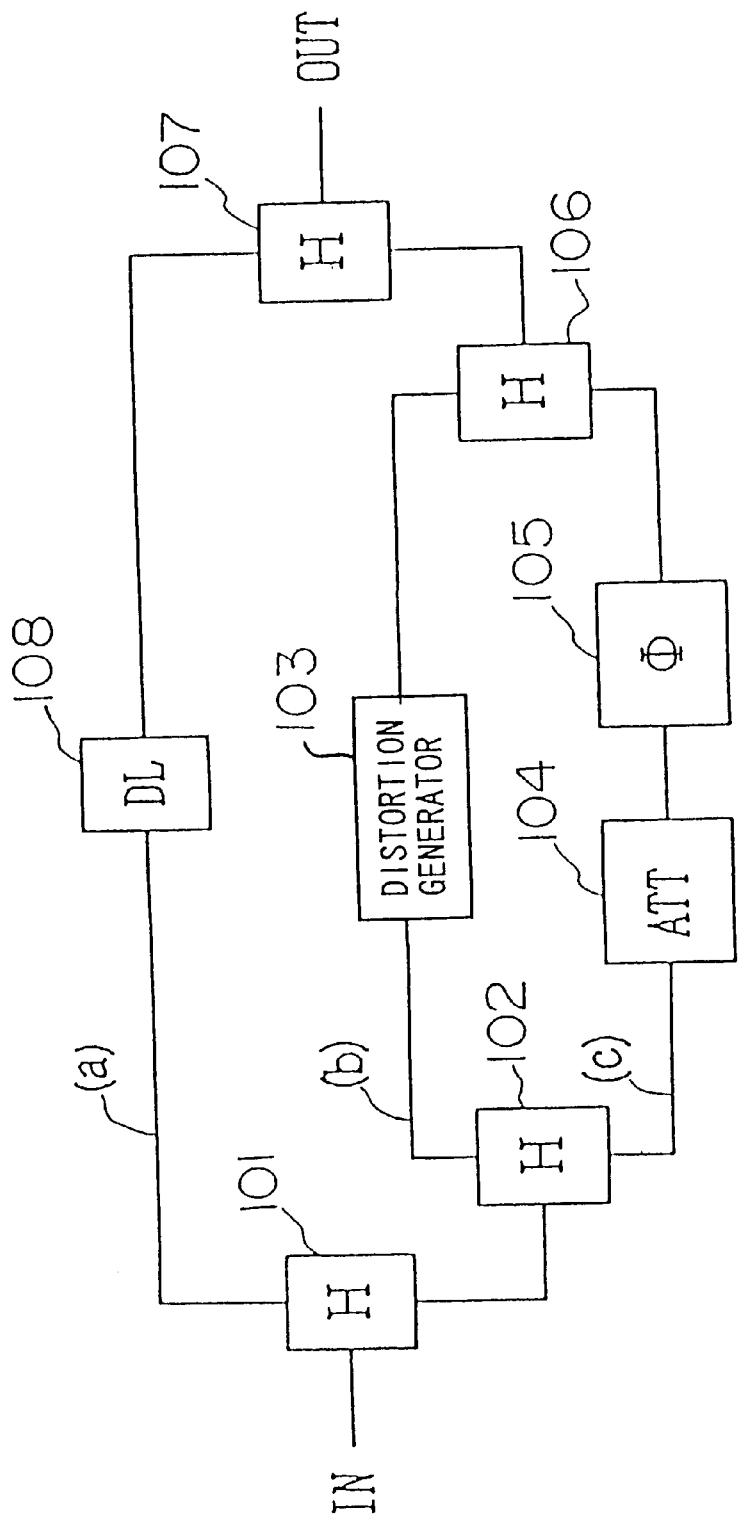
FIG. 24 is a diagram showing the structure of a conventional linearizing circuit.

FIG. 22 shows the structure of the fifteenth embodiment of the present invention, which is actually a combination of the thirteenth embodiment and the twelfth embodiment (FIG. 18). That is, a DC amplifier 61 amplifies the transmission output level signal from the ALC control circuit 55, and this amplified signal is supplied directly to the linearizer 33 as the bias voltage Vo.

The above-described fifteenth embodiment can also be applied to the ninth, eleventh, and twelfth embodiment.

The above discussion will be summarized as follows. First, according to the present invention, the AM-AM distortion is compensated in the IF circuit, while the AM-PM distortion is compensated in the RF circuit or local frequency circuit. This structural arrangement enables provision of a simple and low-cost linearizing circuit to compensate for the distortion.

Second, the present invention provides the following techniques for enhancement: level adjustment of the control signal, spurious elimination, delay compensation, switching of voltage applied to varactor diodes, and temperature compensation. These techniques will contribute to the provision of a high-performance linearizing circuit for distortion compensation.

Third, in a transmitter apparatus with an ATPC circuit, the present invention limits compensatory operations by the linearizing circuits when the transmission power output is set to a low level, thus maintaining the linearity in the input-output characteristics of power amplifiers.

Fourth, the ATPC circuit in the present invention is located at a later stage than a linearizing circuit. This location suppresses deterioration of the carrier-to-noise (C/N) ratio.

The foregoing is considered as illustrative only of the principles of the present invention. Further, since numerous modifications and changes will readily occur to those skilled in the art, it is not desired to limit the invention to the exact construction and applications shown and described, and accordingly, all suitable modifications and equivalents may be regarded as falling within the scope of the invention in the appended claims and their equivalents.

What is claimed is:

1. A transmitter apparatus having an intermediate frequency amplifier for amplifying an intermediate frequency signal, and a radio frequency amplifier for amplifying a radio frequency signal that is converted from the amplified intermediate frequency signal, the transmitter apparatus, comprising:

amplitude distortion compensation means disposed in the intermediate frequency amplifier for compensating for amplitude distortion produced in the radio frequency amplifier; and phase distortion compensation means for compensating for phase distortion produced in the radio frequency amplifier, wherein said phase distortion compensation means is disposed in a local frequency oscillation circuit and is controlled by a control voltage input from said amplitude distortion compensation means.

2. A transmitter apparatus according to claim 1, wherein said amplitude distortion compensation means comprises a field-effect transistor whose gate bias voltage is set near to a pinchoff voltage thereof.

3. A transmitter apparatus according to claim 2, further comprising temperature compensation means having a temperature sensor for applying temperature compensation to said amplitude distortion compensation means by adjusting said gate bias voltage of said field-effect transistor according to a measured value of said temperature sensor.

4. A transmitter apparatus having an intermediate frequency amplifier for amplifying an intermediate frequency signal, and a radio frequency amplifier for amplifying a radio frequency signal that is converted from the amplified intermediate frequency signal, the transmitter apparatus, comprising:

amplitude distortion compensation means disposed in the intermediate frequency amplifier for compensating for amplitude distortion produced in the radio frequency amplifier; and phase distortion compensation means for compensating for phase distortion produced in the radio frequency amplifier, wherein said phase distortion compensation means is a phase shifter including a varactor diode and a branch-line hybrid and said amplitude distortion compensation means produce a beat signal voltage, the transmitter apparatus further comprising voltage applying means for extracting the beat signal voltage from said amplitude distortion compensation means and applying said beat signal voltage to one electrode of said varactor diode.

5. A transmitter apparatus according to claim 4, wherein said voltage applying means has DC amplification means for amplifying said beat signal voltage including a DC component thereof.

6. A transmitter apparatus according to claim 4, wherein said voltage applying means has a lowpass filter for filtering out intermediate frequency signal components contained in said beat signal voltage.

7. A transmitter apparatus according to claim 6, further comprising delaying means disposed in the intermediate frequency amplifier for providing a predetermined delay time corresponding to a delay time of said lowpass filter.

8. A transmitter apparatus according to claim 4, wherein said voltage applying means further applies a bias voltage to the other electrode of said varactor diode and has a selection switch for swapping connections of said beat signal voltage and said bias voltage to the respective electrodes of said varactor diode.

9. A transmitter apparatus according to claim 4, further comprising temperature compensation means equipped with a temperature sensor for applying temperature compensation to said phase distortion compensation means by controlling a bias voltage of said varactor diode in accordance with a measured value of said temperature sensor.

10. A transmitter apparatus having an intermediate frequency amplifier for amplifying an intermediate frequency input signal to produce an intermediate frequency output signal, and a radio frequency amplifier for amplifying a radio frequency signal that is converted from the intermediate frequency output signal, the transmitter apparatus comprising:

amplitude distortion compensation means disposed in the intermediate frequency amplifier for compensating for amplitude distortion produced in the radio frequency amplifier by using a field-effect transistor whose gate bias voltage is set near to a pinchoff voltage thereof, and for producing a beat signal voltage;

phase distortion compensation means having a varactor diode and a branch-line hybrid for compensating for phase distortion produced in the radio frequency amplifier; and voltage applying means for extracting the beat signal voltage from said amplitude distortion compensation means and applying said beat signal voltage to said varactor diode.

11. A transmitter apparatus having an intermediate frequency amplifier for amplifying an intermediate frequency input signal to produce an intermediate frequency output signal, a local frequency oscillator that produces a local frequency signal for conversion from the intermediate frequency output signal to a radio frequency signal, and a radio frequency amplifier for amplifying the radio frequency signal that is converted from the intermediate frequency output signal, the transmitter apparatus comprising:

amplitude distortion compensation means disposed in the intermediate frequency amplifier for compensating for amplitude distortion produced in the radio frequency amplifier;

phase distortion compensation means disposed in the local frequency oscillator for compensating for phase distortion produced in the radio frequency amplifier;

transmission output control means disposed after said amplitude distortion compensation means for controlling a transmission output level based on a field strength of reception signals;

amplitude distortion compensation limiting means for limiting the compensation for the amplitude distortion that is performed by said amplitude distortion compensation means, when the transmission output level is lowered by said transmission output control means; and phase distortion compensation limiting means for limiting the compensation for the phase distortion that is performed by said phase distortion compensation means, when the transmission output level is lowered by said transmission output control means.

12. A transmitter apparatus according to claim 11, wherein said amplitude distortion compensation limiting means detects the lowered transmission output level by monitoring information that is sent to said transmission output control means to indicate the field strength of the reception signals.

13. A transmitter apparatus according to claim 11, wherein said phase distortion compensation limiting means detects the lowered transmission output level by monitoring information that is sent to said transmission output control means to indicate the field strength of the reception signals.

14. A transmitter apparatus according to claim 11, wherein said amplitude distortion compensation limiting means detects the lowered transmission output level by monitoring an output power level of the radio frequency signal amplified by said radio frequency amplifier.

15. A transmitter apparatus according to claim 11, wherein said phase distortion compensation limiting means detects the lowered transmission output level by monitoring an output power level of the radio frequency signal amplified by said radio frequency amplifier.

16. A transmitter apparatus according to claim 11, wherein said amplitude distortion compensation means comprises a field-effect transistor whose gate bias voltage is normally set near to a pinchoff voltage thereof, and said amplitude distortion compensation limiting means limits the compensation for the amplitude distortion by shifting the gate bias voltage of the field-effect transistor away from the pinchoff voltage thereof.

17. A transmitter apparatus according to claim 11, wherein said amplitude distortion compensation means outputs a beat signal voltage, said phase distortion compensation means comprises a phase shifter whose phase shift amount is varied according to the beat signal voltage received from said amplitude distortion compensation means, and said phase distortion compensation limiting means limits the compensation for the phase distortion by reducing the beat signal voltage applied to said phase shifter.

18. A transmitter apparatus according to claim 11, wherein said phase distortion compensation means comprises a phase shifter comprising a varactor diode and a branch-line hybrid, and said phase distortion compensation limiting means limits the compensation for the phase distortion by varying a bias voltage applied to said varactor diode.

* * * * *